(12) United States Patent
Ooishi et al.

(10) Patent No.: US 6,310,807 B1
(45) Date of Patent: Oct. 30, 2001

(54) SEMICONDUCTOR INTEGRATED CIRCUIT DEVICE INCLUDING TESTER CIRCUIT FOR DEFECTIVE MEMORY CELL REPLACEMENT

(75) Inventors: Tsukasa Ooishi; Hideto Hidaka, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/813,917

(22) Filed: Mar. 22, 2001

(30) Foreign Application Priority Data

Oct. 6, 2000 (JP) .................................................. 12-307339

(51) Int. Cl.$^7$ .................................................. G11C 29/00
(52) U.S. Cl. .......................................... 365/200; 365/201
(58) Field of Search .................................. 365/201, 207, 365/208, 210, 241

(56) References Cited

U.S. PATENT DOCUMENTS 5,487,041 * 1/1996 Wada .................................... 365/203

OTHER PUBLICATIONS

Co-pending U.S. patent application Ser. No. 09/459,710, filed Dec. 13, 1999.

Co-pending U.S. patent application Ser. No. 09/793,612, filed Feb. 27, 2001.

* cited by examiner

*Primary Examiner*—Terrell W. Fears
(74) *Attorney, Agent, or Firm*—McDermott, Will & Emery

(57) ABSTRACT

Following data writing into a memory cell array according to an internal address signal, the data read out from each memory cell is compared with expected value data in a readout operation. A row decoder selects a plurality of memory cells belonging to the same row in the memory cell array at one time according to an address signal. A BIST circuit determines that repair is to be carried out with a spare memory cell row, not a spare memory cell column, when a plurality of defective memory cells are detected from the plurality of memory cells selected at one time.

10 Claims, 31 Drawing Sheets

FIG.18

|   |   |   |   | AND | PARITY | NUMBER OF DEFECTS |
|---|---|---|---|---|---|---|
| H | H | H | H | (H) | (L) | (0) |
| H | H | H | H | (H) | (L) | (0) |
| H | H | H | H | (H) | (L) | (0) |
| H | H | H | H | (H) | (L) | (0) |

AND    (H) (H) (H) (H)    (H)

0 DEFECT WITH ENTIRE AND0

PARITY    (L) (L) (L) (L)

NUMBER OF DEFECTS    (0) (0) (0) (0)

*FIG.23*

WHEN ②

| RA | RA | RA | CA | CA |
|---|---|---|---|---|
| RA1 | | | | |

| RA | RA | CA | RA | CA |
|---|---|---|---|---|
| RA1 | | | | |

| RA | CA | RA | RA | CA |
|---|---|---|---|---|
| RA1 | | | | |

| CA | RA | RA | RA | CA |
|---|---|---|---|---|
| CA1 | | | | |

| RA | RA | CA | CA | RA |
|---|---|---|---|---|
| RA1 | | | | |

| RA | CA | RA | CA | RA |
|---|---|---|---|---|
| RA1 | | | | |

| CA | RA | RA | CA | RA |
|---|---|---|---|---|
| CA1 | | | | |

| RA | CA | CA | RA | RA |
|---|---|---|---|---|
| RA1 | | | | |

| CA | RA | CA | RA | RA |
|---|---|---|---|---|
| CA1 | | | | |

| CA | CA | RA | RA | RA |
|---|---|---|---|---|
| CA1 | | | | |

FIG.24

WHEN ③

| RA | RA | RA | CA | CA |
|---|---|---|---|---|
| RA1 | RA2 | | | |

| RA | RA | CA | RA | CA |
|---|---|---|---|---|
| RA1 | RA2 | | | |

| RA | CA | RA | RA | CA |
|---|---|---|---|---|
| RA1 | CA2 | | | |

| CA | RA | RA | RA | CA |
|---|---|---|---|---|
| CA1 | RA2 | | | |

| RA | RA | CA | CA | RA |
|---|---|---|---|---|
| RA1 | RA2 | | | |

| RA | CA | RA | CA | RA |
|---|---|---|---|---|
| RA1 | CA2 | | | |

| CA | RA | RA | CA | RA |
|---|---|---|---|---|
| CA1 | RA2 | | | |

| RA | CA | CA | RA | RA |
|---|---|---|---|---|
| RA1 | CA2 | | | |

| CA | RA | CA | RA | RA |
|---|---|---|---|---|
| CA1 | RA2 | | | |

| CA | CA | RA | RA | RA |
|---|---|---|---|---|
| CA1 | CA2 | | | |

FIG.25

WHEN ④

| RA | RA | RA | CA | CA |
|----|----|----|----|----|
| RA1 | RA2 | | | |

| RA | RA | CA | RA | CA |
|----|----|----|----|----|
| RA1 | RA2 | CA3 | | |

| RA | CA | RA | RA | CA |
|----|----|----|----|----|
| RA1 | CA2 | | | |

| CA | RA | RA | RA | CA |
|----|----|----|----|----|
| CA1 | RA2 | | | |

| RA | RA | CA | CA | RA |
|----|----|----|----|----|
| RA1 | RA2 | CA3 | | |

| RA | CA | RA | CA | RA |
|----|----|----|----|----|
| RA1 | CA2 | | | |

| CA | RA | RA | CA | RA |
|----|----|----|----|----|
| CA1 | RA2 | | | |

| RA | CA | CA | RA | RA |
|----|----|----|----|----|
| RA1 | CA2 | CA3 | | |

| CA | RA | CA | RA | RA |
|----|----|----|----|----|
| CA1 | RA2 | CA3 | | |

| CA | CA | RA | RA | RA |
|----|----|----|----|----|
| CA1 | CA2 | | | |

FIG.26

WHEN ⑤

| RA | RA | RA | CA | CA |
|---|---|---|---|---|
| RA1 | RA2 | RA3 | | |

| RA | RA | CA | RA | CA |
|---|---|---|---|---|
| RA1 | RA2 | CA3 | | |

| RA | CA | RA | RA | CA |
|---|---|---|---|---|
| RA1 | CA2 | RA3 | | |

| CA | RA | RA | RA | CA |
|---|---|---|---|---|
| CA1 | RA2 | RA3 | | |

| RA | RA | CA | CA | RA |
|---|---|---|---|---|
| RA1 | RA2 | CA3 | | |

| RA | CA | RA | CA | RA |
|---|---|---|---|---|
| RA1 | CA2 | RA3 | | |

| CA | RA | RA | CA | RA |
|---|---|---|---|---|
| CA1 | RA2 | RA3 | | |

| RA | CA | CA | RA | RA |
|---|---|---|---|---|
| RA1 | CA2 | CA3 | | |

| CA | RA | CA | RA | RA |
|---|---|---|---|---|
| CA1 | RA2 | CA3 | | |

| CA | CA | RA | RA | RA |
|---|---|---|---|---|
| CA1 | CA2 | RA3 | | |

FIG.27

DISABLE PROCESS BY CANG

WHEN ⑤

| RA | RA | RA | CA | CA |
|----|----|----|----|----|
|RA1 |RA2 |RA3 |    |    |

| RA | RA | CA | RA | CA |
|----|----|----|----|----|
|RA1 |RA2 |CA3 |RA4 |    |

| RA | CA | RA | RA | CA |
|----|----|----|----|----|
|RA1 |CA2 |RA3 |RA4 |    |

| CA | RA | RA | RA | CA |
|----|----|----|----|----|
|CA1 |RA2 |RA3 |RA4 |    |

| RA | RA | CA | CA | RA |
|----|----|----|----|----|
|RA1 |RA2 |CA3 |    |    |

| RA | CA | RA | CA | RA |
|----|----|----|----|----|
|RA1 |CA2 |RA3 |    |    |

| CA | RA | RA | CA | RA |
|----|----|----|----|----|
|CA1 |RA2 |RA3 |    |    |

| RA | CA | CA | RA | RA |
|----|----|----|----|----|
|RA1 |CA2 |CA3 |RA4 |    |

| CA | RA | CA | RA | RA |
|----|----|----|----|----|
|CA1 |RA2 |CA3 |RA4 |    |

| CA | CA | RA | RA | RA |
|----|----|----|----|----|
|CA1 |CA2 |RA3 |RA4 |    |

# SEMICONDUCTOR INTEGRATED CIRCUIT DEVICE INCLUDING TESTER CIRCUIT FOR DEFECTIVE MEMORY CELL REPLACEMENT

BACKGROUND OF THE INVENTION

1. Field of the Invention

The present invention relates to semiconductor integrated circuit devices, particularly to the structure of a semiconductor integrated circuit device mounted with a tester circuit to test a semiconductor memory device.

2. Description of the Background Art

Most semiconductor memory devices include spare memory cells to allow a defective memory cell, if present, to be replaced with the spare memory cell to repair the defective chip.

FIG. 32 is a schematic block diagram showing a structure of a redundant circuit provided for a memory array unit 8010 of such a semiconductor memory device.

One memory cell in memory array unit 8010 is selected by externally applied row address signals RA0–13 and column address signals CA0–8. In a write operation, the data applied to a data input/output terminal DQ (not shown) is written into the selected one memory cell. In a readout operation, the data read out from memory array unit 8010 is provided to data input/output terminal DQ.

A row decoder 8020 responds to an input row address to select memory cells of one row for a read or write operation. A column decoder 8030 selects one column according to an input column address, and further selects one memory cell out of the one row of memory cells selected according to the row address.

Detection of a defective memory cell and analysis to replace that defective memory cell with a redundant memory cell array are generally carried out by an external memory tester of semiconductor memory device 8000.

In these few years, a semiconductor memory device 8000 to be tested, or a semiconductor memory device including the so-called built-in test device that has a signal generator provided in a semiconductor device with a semiconductor memory device to carry out testing without a memory tester, or a semiconductor device incorporating a semiconductor memory device with such a built-in test device are produced.

In such a semiconductor memory device or semiconductor device incorporating such a built-in test device, it is difficult to carry out testing that realizes a redundancy analysis function itself even if the testing of whether there is a defective memory cell or not in the memory cell can be carried out. The failure memory to store the address of the defective memory cell requires a capacity equal to that of the semiconductor memory device to be tested or the semiconductor memory device incorporated in the semiconductor device. In practice, it is difficult to incorporate a failure memory of such a capacity in a semiconductor memory device or a semiconductor device. Therefore, redundancy analysis could not be carried out.

A trend is towards increased data bit width for the data input/output of a semiconductor memory device from the standpoint of speeding up the system. Accordingly, a plurality of memory cells are often selected simultaneously in the memory array. Therefore, the aforementioned redundancy analysis becomes more complicated.

SUMMARY OF THE INVENTION

An object of the present invention is to provide a semiconductor memory device or a semiconductor integrated circuit device incorporating a semiconductor memory device including a built-in tester circuit that can detect, when a plurality of memory cells are selected simultaneously for every sub memory cell array, a defective memory cell, and replace the defective memory cell with a redundant memory cell.

According to an aspect of the present invention, a semiconductor integrated circuit device includes a memory cell array, a memory cell select circuit, a data transmission circuit, and a tester circuit.

The memory cell array has a plurality of memory cells arranged in a matrix. Each memory cell retains data. The memory cell array includes a normal memory cell array with a plurality of normal memory cells, a spare memory cell row including a plurality of spare memory cells, and a spare memory cell column including a plurality of spare memory cells. The memory cell select circuit selects at one time the plurality of memory cells belonging to the same one row in the memory cell array according to an address signal. The data transmission circuit transmits the stored data with respect to the selected plurality of memory cells. The tester circuit detects a defective memory cell in the memory cells and determines which of the spare memory cells is to be used for replacement. The tester circuit includes a comparison circuit, an address storage circuit, and a control circuit. The comparison circuit compares the data stored in the selected memory cell with expected value data in a test readout operation. The address storage circuit stores a defective address corresponding to the defective memory cell according to the comparison result of the comparison circuit. The control circuit controls the test operation. The control circuit determines that repair is to be carried out with the spare memory cell row when detection is made of a plurality of defective memory cells in the plurality of memory cells selected at one time.

Therefore, an advantage of the present invention is that, when a plurality of memory cells are selected simultaneously in a memory cell array, defective memory cell detection and redundancy analysis can be carried out with a relatively low circuit complexity, and that a tester circuit with the redundancy analysis function can be incorporated in the semiconductor integrated circuit device per se.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 18 is a diagram to describe the concept of the operation of the defective number detection circuit.

FIG. 23 is a diagram to describe the manner of storing the detected defective address corresponding to each replacement sequence at time t2.

FIG. 24 is a diagram representing the concept when a defective address is stored at time t3.

FIG. 25 is a diagram representing the concept when a defective address is stored at time t4.

FIGS. 26 and 27 are first and second diagrams, respectively, representing the concept storing newly detected defective addresses RA3 and CA3 in the storage cell train.

DESCRIPTION OF THE PREFERRED EMBODIMENTS

First Embodiment

[Structure of Reading Out 1-Bit Data Per Memory Cell Array]

Figure 1:
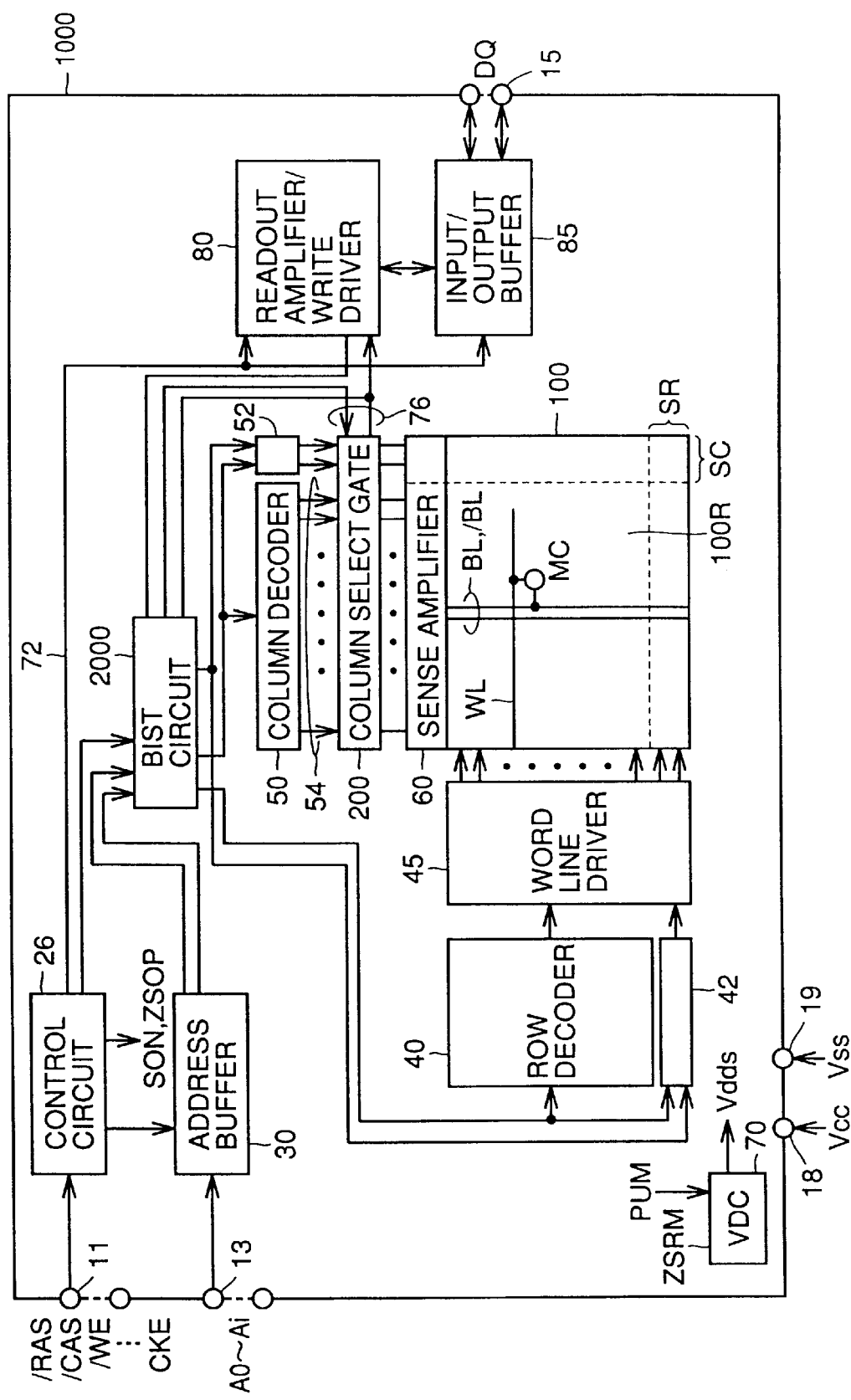
FIG. 1 is a block diagram schematically showing an entire structure of a dynamic type semiconductor memory device 1000 according to a first embodiment of the present invention.

FIG. 1 is a schematic block diagram showing an entire structure of a dynamic semiconductor memory device (referred to as DRAM hereinafter) 1000 having data of 1 bit read out per sub memory array.

As will become apparent from the following, the built-in tester circuit of the present invention is not limited to application to a DRAM 1000 shown in FIG. 1, and can be generally applied to the testing of a semiconductor memory device that is incorporated together with a logic circuit and the like in a semiconductor integrated circuit device.

Referring to FIG. 1, DRAM 1000 includes a control signal input terminal group 11 receiving control signals such as a row address strobe signal /RAS, a column address strobe signal /CAS, a write enable signal /WE, a chip enable signal /CE and a clock enable signal CKE, an address input terminal group 13 receiving address signals A0–Ai (i: natural number), a data input/output terminal group 15 to input/output data, a Vcc terminal 18 receiving an external power supply potential Vcc, and a Vss terminal 19 receiving a ground potential Vss.

A signal CKE applied to control signal input terminal group 11 is a signal to designate that input of a control signal to the chip is allowed.

DRAM 1000 further includes a control circuit 26 generating an internal control signal that controls the operation of the entire DRAM 1000 according to a control signal, an internal control signal bus 72 through which the internal control signal is transmitted, an address buffer 30 receiving an external address signal from address input terminal group 13 to generate an internal address signal, and a memory cell array 100 with a plurality of memory cells MC arranged in a matrix.

FIG. 1 shows the case where one memory cell 100 is provided. However, a plurality of memory cell arrays 100 may be provided. In this case, a structure is implemented where data of 1 bit is read out per one memory cell array.

An internal address signal implies internal row address signals RA0–13 and /RA0–13 complementary to each other and generated from external row address signals RA0–13, and internal column address signals CA0–8 and /CA0–8 complementary to each other and generated from external column signals CA0–8.

Memory cell MC is constituted by a capacitor to retain data, and an access transistor GM having a gate connected to a word line WL corresponding to each row.

In memory cell array 100, a word line WL is provided corresponding to each row of memory cells, and bit lines BL, /BL are provided corresponding to each column of memory cells.

Memory cell array 100 of FIG. 1 includes a normal memory cell array 100, a spare row SR and a spare column SC, similar to memory cell array unit 8010 of FIG. 39.

In memory cell array 100, two spare rows SR1 and SR2 are provided as spare row SR, and two spare columns SC1 and SC2 are provided as spare column SC.

DRAM 1000 further includes a built-in self tester circuit (referred to as BIST circuit hereinafter) 2000 that detects a defective memory cell in DRAM 1000 and carries out a testing operation to effect replacement with a spare row SR or a spare column SC.

BIST circuit 2000 is under control of a control circuit 26 to provide internal row and column address signals from address buffer 30 directly to row decoder 40, spare row decoder 42, column decoder 50 and spare column decoder 52 in a normal operation mode. BIST circuit 2000 receives through data input/output terminal group 15 write data that is buffered by an input/output buffer 85 and provided from write driver circuit 80. The write data is directly output to column select gate 200 in a normal operation.

In the test mode, BIST circuit 2000 provides to row decoder 40, spare row decoder 42, column decoder 50 and spare column decoder 52 an internal address signal, generated within BIST 2000, not directly from address buffer 30. Test data is written into memory cell array 100 by applying to a column select gate 200 test write data TD generated within BIST circuit 2000, not the data applied from write driver 80.

When the write operation is completed in the test mode, BIST circuit 2000 generates an internal address signal again to read out the sequentially written data. BIST circuit 2000 sequentially detects the position of a defective memory cell in normal memory cell array 100 according to the comparison result between the read out data and expected value data ED. Then, determination is made of which combination of a spare row SR and a spare column SC the plurality of defective row addresses and defective column addresses corresponding to the plurality of defective memory cells are to be replaced with.

Upon completion of a read operation in the test mode, spare row decoder 42 and spare column decoder 52 store in a non-volatile manner respective defective row and column addresses that are to be replaced according to the determination of BIST circuit 2000. Therefore, a structure including an non-volatile storage element that can electrically write and read a replacement address designated from BIST circuit 2000 can be provided for spare row decoder 42 and spare column decoder 52. Alternatively, a structure in which the address corresponding to the memory cell to be replaced can be output to an external source at the end of the test operation. In this case, an external tester may provide an instruction to a repair device according to the output replacement address, whereby the repair device trims the fuse element of spare row decoder 42 and spare column decoder 52, as in the conventional case.

Following the above-described redundancy analysis by BIST circuit 2000, the normal read out and writing operations are to be carried out.

In the normal read and write operations, word line driver 45 selectively renders a corresponding word line WL active according to the output of row decoder 40 that decodes an internal row address signal from address buffer 30. Here, spare row decoder 42 activates word line WL of spare row SR and applies an instruction to row decoder 40 to inhibit a row select operation when the defective row address stored in a non-volatile manner matches the internal row address from address buffer 30.

According to the output of column decoder 50 that decodes an internal column address signal from address buffer 30, column decoder 50 renders a column select signal active. Spare column decoder 52 activates the column select signal corresponding to spare column SC and applies an instruction to column decoder 50 to inhibit a select operation when the internal column address signal from address buffer 30 matches the stored defective column address stored in a non-volatile manner.

The column select signal is applied to column select gate 200 through a column select line 54. Column select gate 200 selectively connects a sense amplifier 60 that amplifies the data of bit line pair BL, /BL according to the column select signal with an I/O line 76.

I/O line 76 transmits the stored data to/from data input/output terminal 15 via a read out amplifier/write driver 80 and an input/output buffer 85. Accordingly, the stored data is transferred between data input/output terminal 15 and memory cell MC in a normal operation mode.

Control circuit 26 generates an internal control signal to control the internal operation of DRAM 1000 such as signals SON and ZSOP to render sense amplifier 60 active when control of the initiation/termination of the test operation of BIST circuit 2000 is carried out or when a read out operation is specified by a combination of external control signals.

DRAM 1000 further includes an internal potential generation circuit 70 receiving external power supply potential Vcc and ground potential Vss to generate an internal power supply potential Vdds corresponding to the potential of an H level (logical high) of the bit line pair. The generated potential is supplied to sense amplifier 60.

Figure 2:
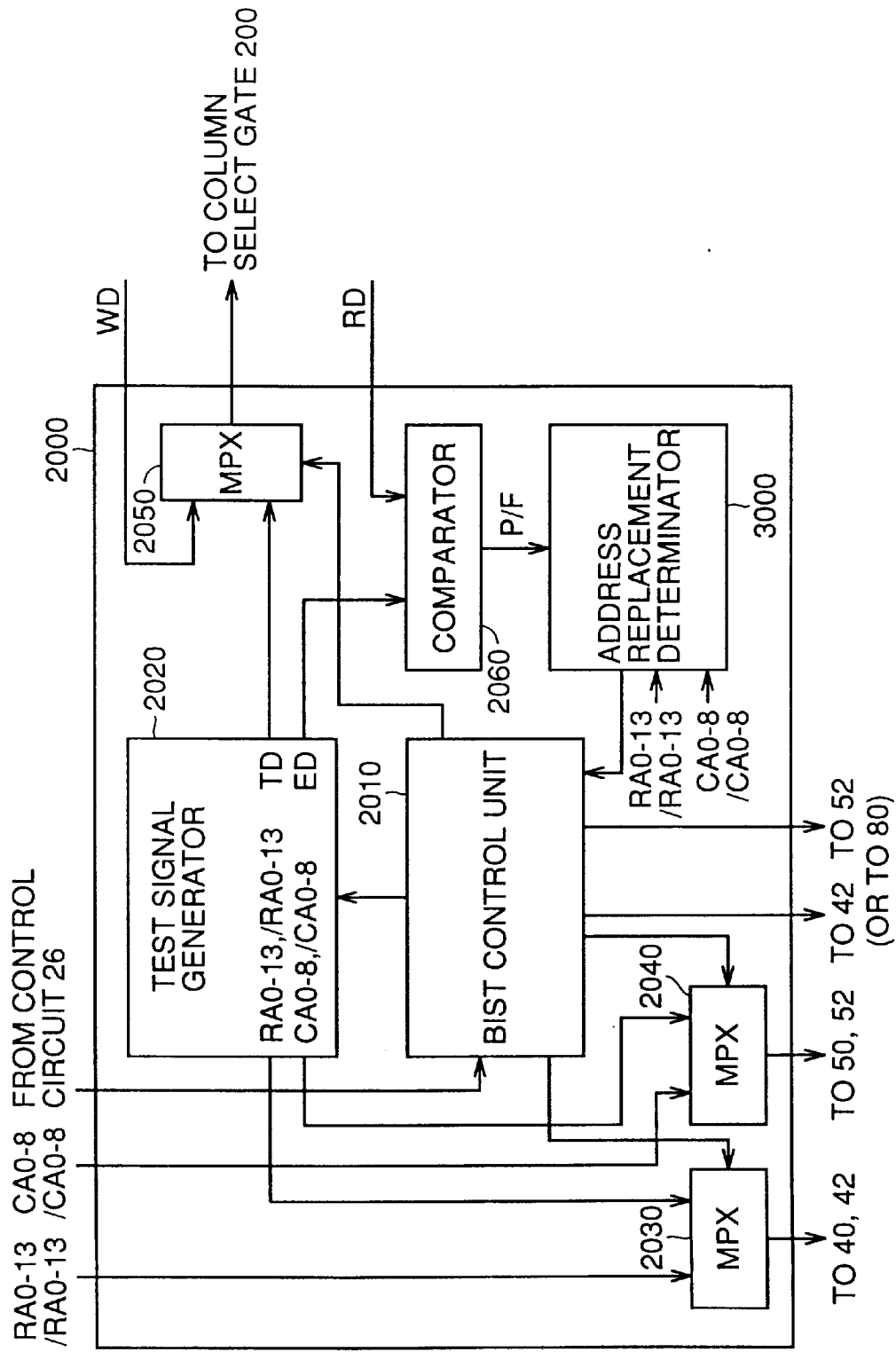
FIG. 2 is a schematic block diagram to describe a structure of a BIST circuit 2000 of FIG. 1.

Referring to FIG. 2, BIST circuit 2000 includes a BIST control unit 2010 to control a built-in test operation according to the control from control circuit 26, a test signal generator 2020 generating internal row address signals RA0–13, /RA0–13, internal column address signals CA0–8, /CA0–8, test write data TD and expected value data ED during a built-in test operation under control of BIST control unit 2010, a multiplexer 2030 under control of BIST control unit 2010, receiving internal row address signals RA0–13, /RA0–13 from address buffer 30 and the internal row address signal from test signal generator 20 to selectively apply one of the internal row address signals to row decoder 40 and spare row decoder 42 according to the operation mode, a multiplexer 2040 under control of BIST control unit 2010, receiving internal column address signals CA0–8, /CA0–8 from address buffer 30 and the internal column address signal from test signal generator 2020 to selectively provide one of the internal column address signals to column decoder 50 and spare column decoder 52 according to the operation mode, a multiplexer 2050 under control of BIST control unit 2010, receiving write data WD from write driver 80 and test write data TD from test signal generator 2020 to provide one of the write data to column select gate 200 according to the operation mode, a comparator 2060 comparing data RD read out from column select circuit 200 with expected value data ED from test signal generator 2020 to output a pass/fail signal P/F according to the match/mismatch of the comparison result in a read out operation in the built-in test mode, and an address replacement determinator 3000 receiving an internal column address signal and an internal row address signal output from test signal generator 2020 during the built-in test mode, and responsive to activation of pass/fail signal P/F from comparator 2060 (when data ED does not match data RD) to store the defective address in normal memory cell array 100 and to determine the defective address of the defective memory cell to be replaced with spare row SR and spare column SC.

When spare row decoder 42 and spare column decoder 52 include non-volatile storage elements that can be electrically rewritten according to the comparison result of address replacement determinator 3000, BIST control unit 2010 programs in these non-volatile storage elements the defective address corresponding to the defective memory cell to be replaced. Also, BIST control unit 2010 reads out the defective address to be replaced according to the determination result of address replacement determinator 3000 and provides the read out defective address outside from input/output terminal group 15 via amplifier 80 and input/output buffer 85.

Prior to description of the structure of address replacement determinator 3000 of FIG. 2 with reference to FIG. 3, the procedure of replacing the defective address in memory cell array 100 of FIG. 1 with spare row SR and spare column SC is summarized in the following.

It is assumed that the same defective memory cells in memory cell array unit 8010 of FIG. 39 are encountered in memory cell array 100 of the present embodiment.

Referring to FIG. 39 again, eight defective memory cells DBM1–DBM8 are detected while sequentially altering the row address and also the column address. The presence of a defective memory cell is detected in the sequence of defective memory cells DBM1–DBM8.

In the case where a defective address replacement process corresponding to defective memory cells is to be carried out with two spare rows SR1 and SR2 and two spare columns SC1 and SC2, there is the instance of all the defective memory cells being repaired or not depending on which sequence the spare row and spare column replaces the normal memory cell row or normal memory cell column corresponding to the defective memory cell.

For example, in the case where defective memory cell DBM1 (row address RF1, column address CF1) is replaced with spare row memory cell SRM1, defective memory cells DBM2–DBM4 (row address: both RF2; column address: CF2, CF3, CF4, respectively) are replaced with the second spare row memory cell SRM2, defective memory cells DBM5–DBM7 (column address: both CF5; row address: RF3, RF4, RF5, respectively) are replaced with the first spare column memory cell SCM1, and defective memory cell DBM8 (row address: RF8; column address: CF8) is replaced with the second spare column memory cell SCM2, all the defective memory cells DBM1–DBM8 can be replaced with the two spare rows SR1 and SR2 and the two spare columns SC1 and SC2.

However, when replacement is carried out in the order of replacing defective memory cell DBM1 with first spare column memory cell SCM1, defective memory cell DBM2 with second spare column memory cell SCM2, and then the third defective memory cell DBM3 with the first spare row memory cell SRM1, and the fifth defective memory cell DBM5 with the second spare row memory cell SRM2, not all the defective memory cells can be repaired by replacement with the two spare rows and two spare columns.

Thus, in the process where a defective memory cell is sequentially detected and replaced with a spare row or spare column, repair is allowed or not allowed depending upon the sequence of the replacement process of the spare row and spare column, as well as the distribution of the defective memory cells in the normal memory array.

In the case of two spare rows and two spare columns, there are the following sixth types of combinations of the sequence in which the sequentially detected defective memory cell is replaced with a spare row and a spare column depending upon the order of the step that carries out replacement with a spare row or a spare column out of the four steps of respective replacements.

In the following, R represents the case where replacement is carried out with a spare row and C represents the case where replacement with a spare column is carried out.

Case 1: R→R→C→C
Case 2: R→C→R→C
Case 3: R→C→C→R
Case 4: C→R→R→C
Case 5: C→R→C→R
Case 6: C→C→R→R Such combinations can be determined if the step out of the four steps that is to be carried out for replacement with a spare row is defined. The total number of such combinations corresponds to the number of combinations of $_{(2+2)}C_2 = 4!/(2! \cdot 2!) = 6$ when two are to be output from a total of 4(2spare rows+2spare columns). Here, k! represents the factorial of a natural number k.

More generally, when there are m spare rows and n spare columns, the number of such combinations corresponds to $_{(m+n)}C_n = {_{(m+n)}C_m} = (m+n)!/(m! \times n!)$ types.

When all the defective memory cells can be eventually replaced and repaired by two spare rows and two spare columns, there is inevitably a replacement process sequence of a spare row and spare column out of the above sixth types of sequence that allows all the defective memory cells to be repaired.

Figure 3:
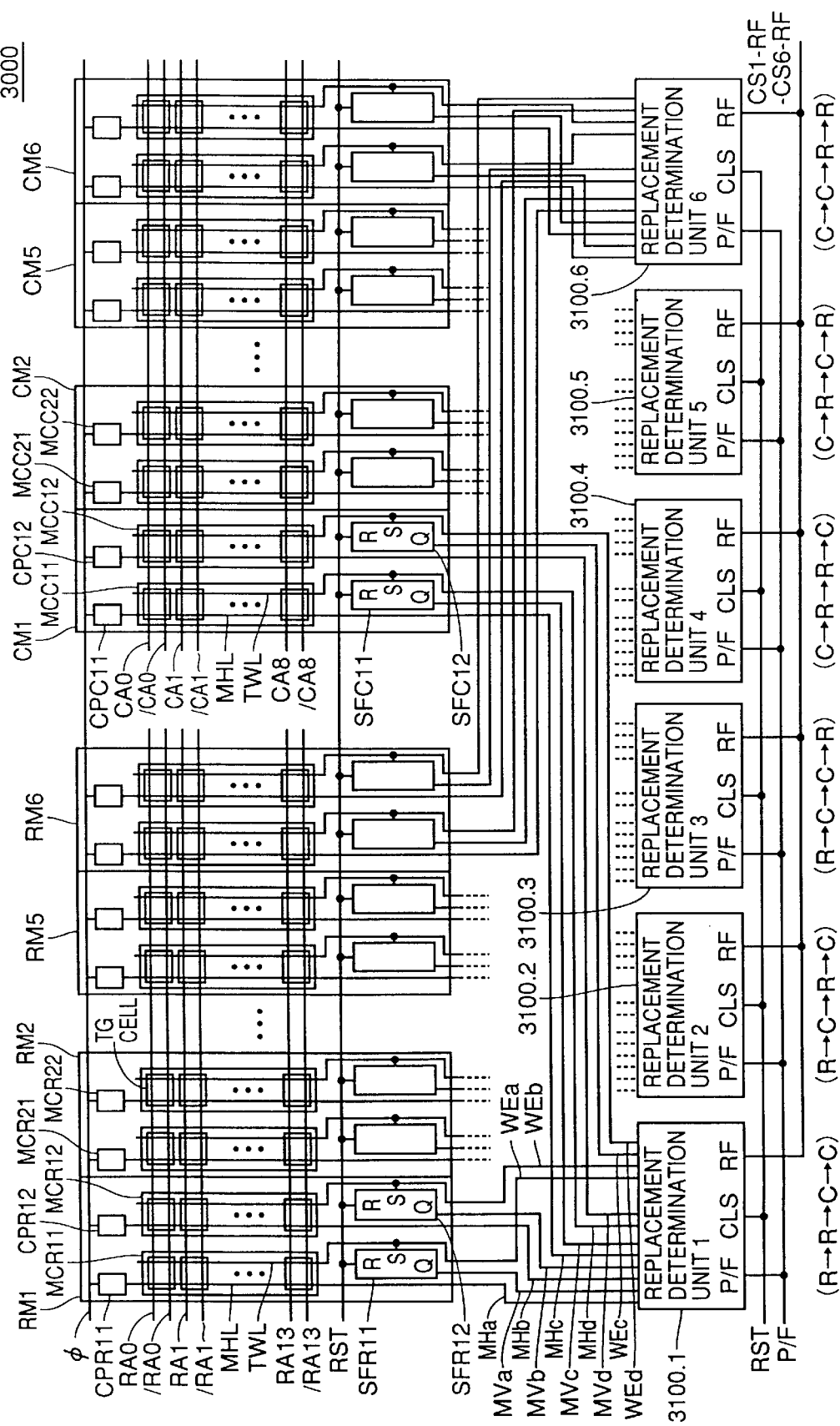
FIG. 3 is a schematic block diagram to describe a structure of an address replacement determinator 3000 of FIG. 2.

In address replacement determinator 3000 of FIG. 3, a structure of processing in parallel the sixth types is implemented to allow each of the above sixth types to be determined in parallel.

Referring to FIG. 3, address replacement determinator 3000 includes first to sixth replacement determination units 3100.1–3100.6 to determine whether repair is possible or not by replacement of the defective address when the defective address replacement process is carried out corresponding to each of the above cases 1–6.

Address replacement determination unit 3000 further includes row address storage units RM1–RM6 each storing the row address to be replaced with two spare row addresses, and column address storage units CM1–CM6 storing the column address to be replaced with two column addresses, corresponding to first replacement determination unit 3100.1 to sixth replacement determination unit 3100.6.

A row address storage unit RM1 and a column address storage unit CM1 are provided corresponding to first replacement determination unit 3100.1 that corresponds to the above case 1, i.e. the process of carrying out replacement with a spare row two times continuously, and then carrying out replacement with a spare column two times continuously.

Row address storage unit RM1 includes a storage cell train CMR11 to store the address of the row to be replaced with the first spare row SR1, and a storage cell train MCR12 to store the address of the row to be replaced with the second spare row SR2.

Column address storage unit CM1 includes a storage cell train MCC11 to store the address of the column to be replaced with the first spare column SC1, and a storage cell train MCC1 to store the address of the column to be replaced with the second spare column SC2.

Since first replacement determination unit 3100.1 corresponds to the above case 1, determination is made whether the current internal address signal is to be written into the storage cell train at every activation of pass/fail signal P/F in the sequence of storage cell train MCR11, storage cell train MCR12, storage cell train MCC11, and storage cell train MCC12 in corresponding row address storage unit RM1 and column address storage unit CM1.

Charge circuits CPR11, CPR12, CPC11, CPC12 are provided corresponding to memory cell columns MCR11, MCR12, MCC11, MCC12. Each of precharge circuits CPR11–CPC12 precharge to an H level a match determination line MHL provided corresponding to storage cell trains MCR11–MCC12 according to a signal φ.

Memory cell columns MCR11 and MCR12 include a TG cell provided corresponding to the 14 sets of internal row address signals RA0, /RA0 to internal row address signals RA13, /RA13 to store the level of these signals.

Similarly, storage cell trains MCC11 and MCC12 include a TG cell provided corresponding to the sets of internal column address signals CA0, /CA0 to internal column address signals CA8, /CA8 to store the signal level of these signals.

The TG cell in row address storage unit RM1 and column address storage unit CM1 stores the level of a corresponding internal row address signal or internal column address signal in response to write activation line TWL attaining an active level (H level) according to designation from a corresponding first replacement determination unit 3100.1.

Match determination line MHL precharged to the H level maintains the H level when the level of the address signal already stored in the storage cell train matches the current level of internal address signals RA0, /RA0~RA13, /RA13 or internal column address signals CA0, /CA0~CA8, /CA8 applied to address replacement determinator 3000. When the levels of the address signals do not match, match determination line MHL is driven to an L level.

Also, flip-flop circuits SFR11, SFR12, SFC11, and SFC12 are provided corresponding to storage cell trains MCR11, MCR12, MCC11 and MCC12, respectively. Flip-flop circuits SFR11~SFC12 have their levels reset by a reset signal RST prior initiation of a test operation, and set in response to write select line TWL of the corresponding storage cell train attaining an active state (H level).

Second replacement determination unit 3100.2 are provided with a row address storage unit RM2 and a column address storage unit CM2 corresponding to the process of alternately carrying out replacement with a spare row and replacement with a spare column. Second replacement determination unit 3100.2 determines whether to write in the current internal address signal into the storage cell train at every activation of pass/fail signal P/F in the sequence of storage cell train MCR21, storage cell train MCC21, storage cell train MCR22 and storage cell train MCC22 in corresponding row address storage unit RM2 and column address storage unit CM2. The remaining structure is similar to that of first replacement determination unit 3100.1.

The same applies for the third to sixth replacement determination units 3100.3~3100.6, provided that the corresponding storage cell train and the sequence of writing into the storage cell train differ. The remaining structure is similar to that of replacement determination unit 3100.1, and description thereof will not be repeated.

According to the above structure, replacement determination unit 3100.1 operates as set forth in the following.

When pass/fail signal P/F is rendered active, first replacement determination unit 3100.1 renders write select line TWL of storage cell train MCR11 active. In response, the level of flip-flop circuit SFR11 corresponding to storage cell train MCR11 is set, and data is stored indicating that an address signal has been already written into this storage cell train MCR11.

When pass/fail signal P/F is rendered active again, respective TG cells carry out comparison between the internal row address signal stored in storage cell train MCR11 and the level of the current internal row address signal. The level of match detection line MHL of storage cell train MCR11 is driven according to the comparison result. When the internal row address stored in storage cell train MCR11 matches the internal row address corresponding to the newly detected defective memory cell, first replacement determination unit 3100.1 does not render storage cell train MCR12 active.

When the internal row address already stored in storage cell train MCR11 does not match the internal row address corresponding to the newly detected defective memory cell, first replacement determination unit 3100.1 renders active write select line TWL of storage cell train MCR12 that is to be the second activated storage cell train.

The internal row address corresponding to the newly detected defective memory cell is written into the second storage cell train MCR12, and the level of flip-flop circuit SFR12 corresponding to storage cell train MCR12 attains a set state.

In a similar manner, the internal row address or internal column address already stored in the storage cell train is compared with the internal row address or internal column address corresponding to the defective memory cell, every time a defective memory cell is newly detected. When the internal row addresses do not match, the corresponding storage cell train is rendered active according to the sequence of case 1 corresponding to first replacement determination unit 3100.1.

In contrast, when the internal row or column address already stored in the storage cell train matches the internal row or column address corresponding to the newly detected defective memory cell, first replacement determination unit 3100.1 does not render active the storage cell train corresponding to the next sequence.

Eventually, determination is made that all the defective memory cells can be replaced and repaired by replacing the defective memory cell with a spare row or a spare column in the sequence corresponding to first replacement determination unit 3100.1 when the internal row address and internal column address of all the defective memory cells that are sequentially detected match the internal row address or internal column address already stored in row address storage unit MR1 and column address storage unit CM1 during the check of the normal memory cell in the built-in test. The determination result is applied to address replacement determinator 3000 to BIST control unit 2010 as a repair fail signal RF.

A similar structure corresponding to first replacement determination unit 3100.1 and associated row and column address storage units RM1 and CM1 is provided corresponding to second replacement determination unit 3100.2 to sixth replacement determination unit 3100.6. Each replacement determination unit activates the storage cell train in the row address storage unit and the storage cell train in the column address storage unit along a corresponding sequence due to the correspondence of second replacement determination unit 3100.2—sixth replacement determination unit 3100.6 with cases 2–6, respectively.

If the defective memory cells in normal memory cell array 100R can be repaired by two spare rows and two spare columns as shown in FIG. 1, the repair fail signal RF from at least one of first replacement determination unit 3100.1 to sixth replacement determination unit 3100.6 maintains an inactive state (L level) even at the time when the last defective memory cell is detected.

Accordingly, BIST control unit 2010 reads out the internal row address signal and the internal column address signal stored in the row address storage unit and the column address storage unit corresponding to the replacement determination unit providing an inactive repair fail signal RF. According to the read out internal row address signal and internal column address signal, the row address and the column address to be repaired can be programmed with respect to spare row decoder 42 and spare column decoder 52.

Thus, there are 2×6=12 storage cell trains for row address units RM1–RM6. There are 2×6=12 storage cell trains for column address storage units CM1-RM6. Therefore, there is a total of 24 storage cell trains.

Figure 4:
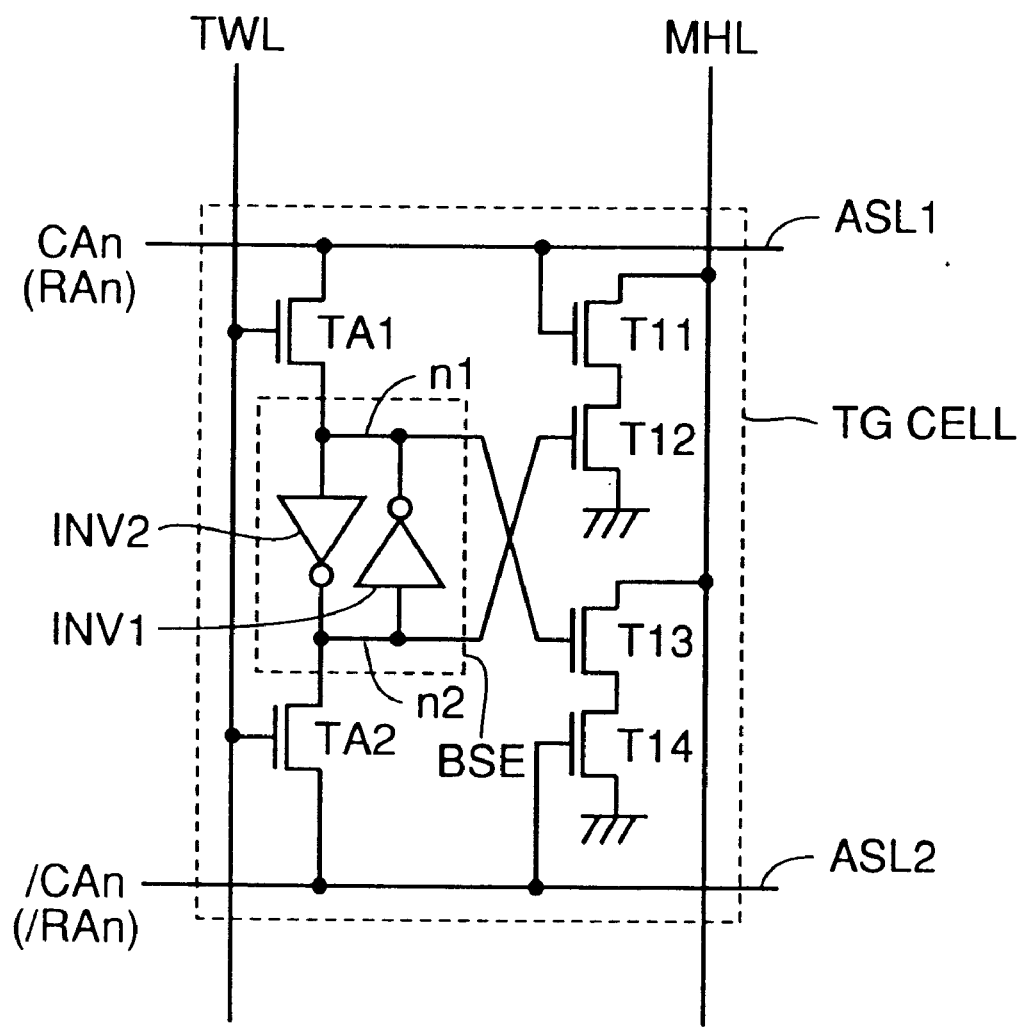
FIG. 4 is a circuit diagram showing a structure of a TG cell of FIG. 3.

FIG. 4 is a circuit diagram showing a structure of the TG cell of FIG. 3.

TG cell includes an address signal line ASL1 to transmit an internal column address signal CAn or an internal row address signal RAn (n: natural number; n=0–13 for RAn and n=0–8 for CAn), a storage element BSE formed of two inverters INV1 and INV2, an N channel type access transistor TA1 for connecting a storage node n1 of storage element BSE with address signal line ASL1 according to the level of signal line TWL, an address signal line ASL2 for transmitting an internal address signal /CAn or /RAn complementary to address signals CAn or RAn, an N channel type access transistor TA2 for connecting a storage node n2 of storage element BSE with address signal line ASL2 according to the level of signal line TWL, N channel transistors T11 and T12 connected in series between match detection line MHL and the ground potential, and transistors T13 and T14 connected in series between match detection line MHL and the ground potential.

Transistor T11 has its gate connected to address signal line ASL1. Transistor T12 has its gate connected to storage node n2 of storage element BSE.

Transistor T13 has its gate connected to storage node n1 of storage element BSE. Transistor T14 has its gate connected to address signal line ASL2.

More specifically, storage element BSE is connected to address signal lines ASL1 and ASL2 according to activation of write select line TWL. When the data stored in storage element BSE does not match the internal address signal on address signal lines ASL1 and ASL2, match detection line MHL is connected to the ground potential to be discharged via the path of transistors T11 and T12 or the path of transistors 13 and T14.

Figure 5:
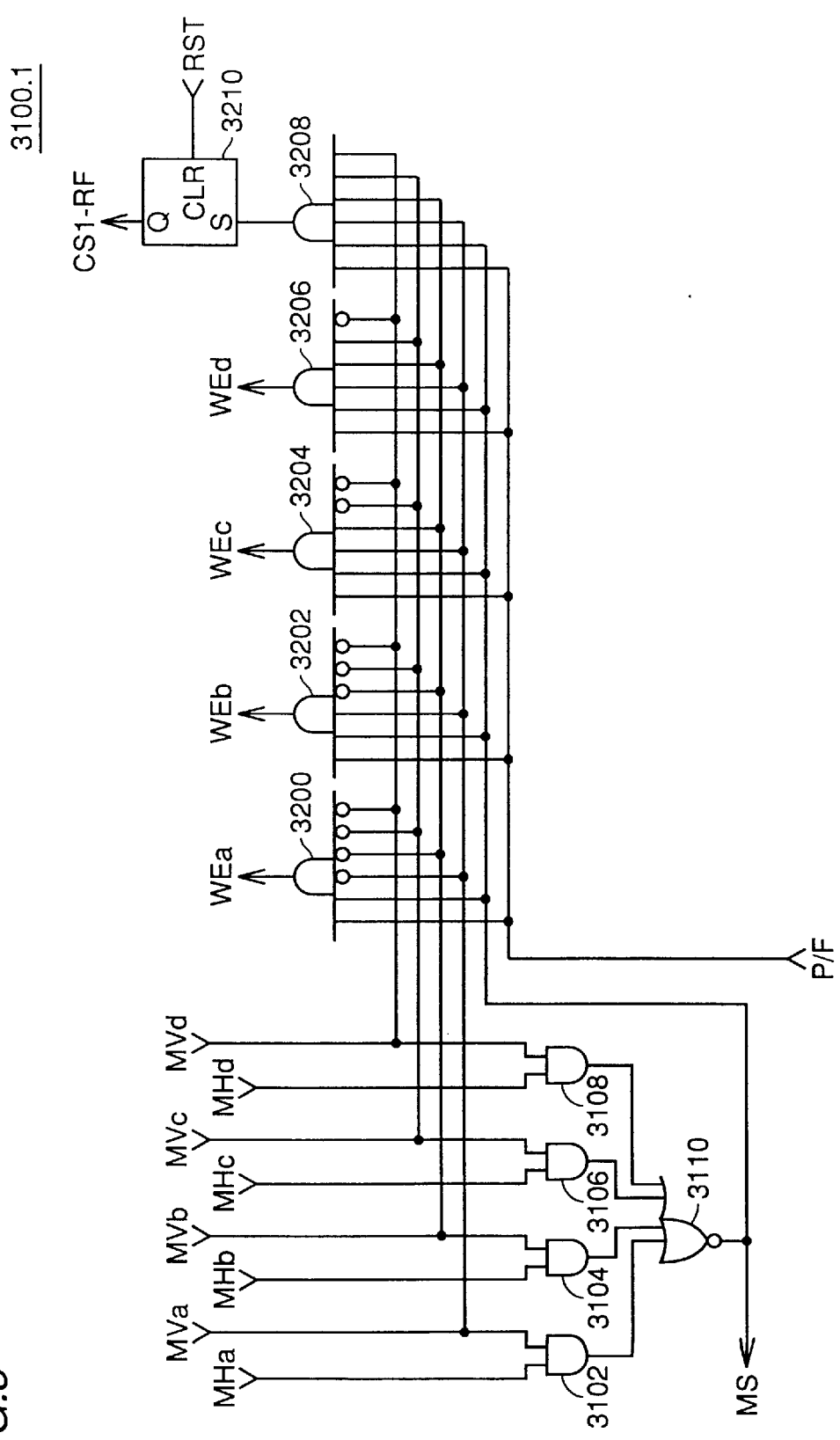
FIG. 5 is a schematic block diagram to describe a structure of a first redundancy determination unit 3100.1 of FIG. 3.

FIG. 5 is a schematic block diagram for describing a structure of first replacement determination unit 3100.1 of FIG. 3.

The structures of second replacement determination unit 3100.2 to sixth replacement determination unit 3100.6 are basically similar, provided that the connected storage cell train differs.

First replacement determination unit 3100.1 includes an AND circuit 3102 having the input node connected with match detection line MHL of storage cell train MCR11 and the output of flip-flop circuit SFR11, an AND circuit 3104 having the input node connected with match detection line MHL of storage cell train MCR12 and the output of flip-flop circuit SFR12, an AND circuit 3106 having the input node connected with match detection line MHL of storage cell train MCC11 and the output of flip-flop circuit SFC11, an AND circuit 3108 having the input node connected with match detection line MHL of storage cell train MCC12 and the output of flip-flop circuit SFC12, and a 4-input NOR circuit 3110 receiving the outputs of AND circuits 3102–3108 to output a signal MS.

As to the input nodes of AND circuits 3102–3108 of first replacement determination unit 3100.1, the input nodes connected with match detection line MHL are represented as nodes MHa, MHb, MHc, MHd, and the input nodes connected with the output of flip-flop circuits SFR11–SFC12 are represented as nodes MVa, MVb, MVc, MVd.

First replacement determination unit 3100.1 further includes a logic gate 3200 receiving an inverted signal of the level of node MVa, the inverted signal of the level of node MVb, the inverted signal of the level of node Mvc, the inverted signal of the level of node MVd, signal MS, and pass/fail signal P/F to output the logical product of these signals as a write select signal WEa that is applied to write select line TWL of storage cell train MCR11, a logic gate 3202 receiving a signal of the level of node MVa, the inverted signal of the level of node MVb, the inverted signal of the level of node Mvc, the inverted signal of the level of node MVd, signal MS, and pass/fail signal P/F to output the logical product of these signals as a write select signal WEc that is applied to write select line TWL of storage cell train MCR12, a logic gate 3204 receiving the signal of the level of node MVa, the signal of the level of node MVb, the inverted signal of the level of node MVc, the inverted signal of the level of node MVd, signal MS, and pass/fail signal P/F to output the logical product of these signals as a write select signal WEc that is applied to write select line TWL of storage cell train MCC11, and a logic gate 3206 receiving the signal of the level of node MVa, a signal of the level of node MVb, a signal of the level of node MVc, an inverted signal of the level of node MVd, signal MS, and pass/fail signal P/F to output a logical product of these signals as a write select signal WEd that is applied to write select line TWL of storage cell train MCC12.

First replacement determination unit 3100.1 further includes a 6-input AND circuit 3208 receiving a signal of the level of node MVa, a signal of the level of node MVb, a signal of the level of node MVc, a signal of the level of node MVd, signal MS, and pass/fail signal P/F to output a logical product of these signals, and a flip-flop circuit 3210 reset according to reset signal RST and set according to the output of AND circuit 3208 to provide a repair fail signal CS1-RF for case 1.

The operation of address replacement determinator 3000 of FIG. 3 will be described in further detail.

Figure 6:
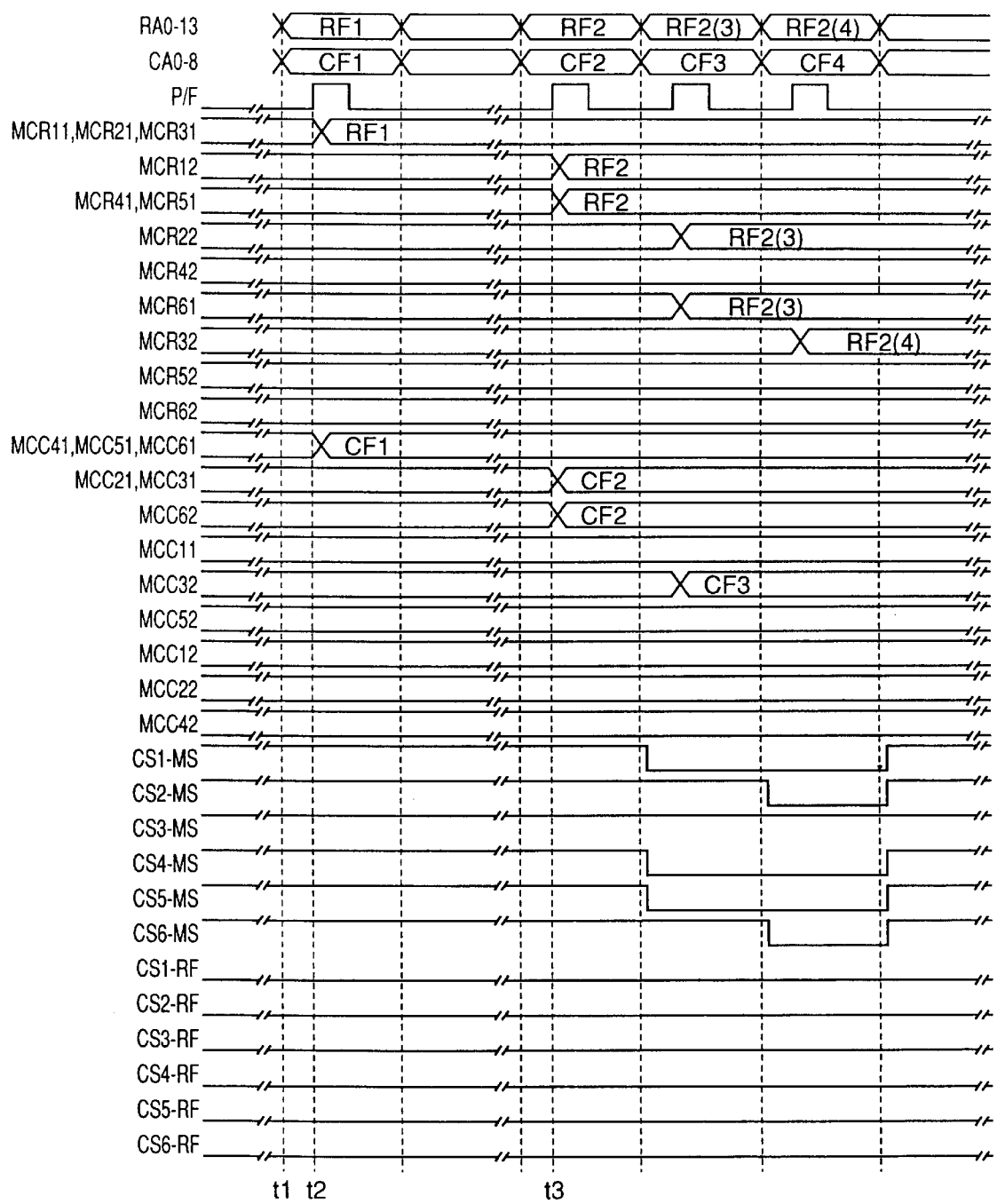
FIGS. 6 and 7 are first and second timing charts, respectively, to describe an operation of address replacement determinator 3000.
Figure 7:
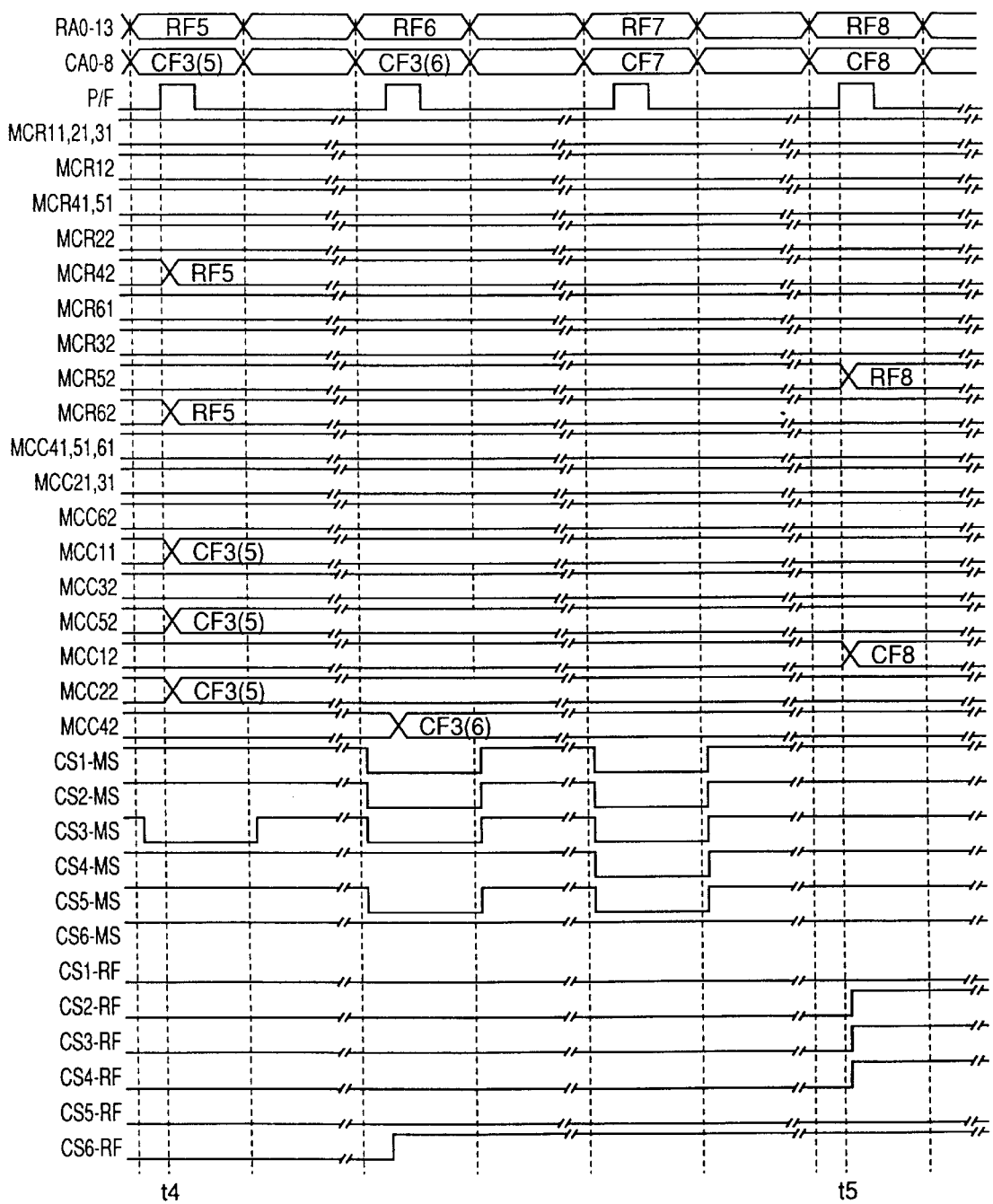

FIGS. 6 and 7 are timing charts for describing an operation of address replacement determinator 3000.

The following description corresponds to the case where a defective memory cell is defected in the sequence of defective memory cells DBM1–DBM8 shown in FIG. 39.

Although not shown in FIG. 6, reset signal RST is rendered active to effect a clear operation for all the flip-flops prior to testing. Also, match determination line MHL is precharged to the H level according to signal φ prior to each match determination operation.

The operation of first replacement determination unit 3100.1 and the operation of storage cell trains MCR11, MCR12, MCC11 and MCC12 connected thereto will be described here.

As mentioned before, first replacement determination unit 3100.1 corresponds to the process of replacing a detected defective memory cell according to the sequence of spare row→spare row→spare column→spare column.

Referring to FIG. 6, the MS node (corresponds to signal CS1-MS in FIG. 6) of first replacement determination unit 3100.1 is at an H level since nodes MVa, MVb, MVc and MVd all are at an L level, i.e. all the values of storage cell trains MCR11, MCR12, MCC11 and MCC12 are not yet written at time t1.

At time t2 when a defective memory cell DBM1 is detected and signal P/F is rendered active (H level), write select signal WEa for storage cell train MCR11 attains an H level, whereby row address RF1 of defective memory cell DBM1 is written into storage cell train MCR11.

At the next detection of defective memory cell DBM2, node MVa is at an H level according to the signal from flip-flop circuit SFR11 corresponding to storage cell train MCR11. However, node MHa does not attain an H level since the value stored in storage cell train MCR11 does not match the row address of defective memory cell DBM2. In response to the MS node of first replacement determination unit 3100.1 attaining an H level and signal P/F attaining an H level at time t3, write select signal WEb corresponding to storage cell train MCR12 is driven to an H level, whereby row address RF2 of defective memory cell DBM2 is written into storage cell train MCR12.

At the next detection of defective memory cell DBM3, the MS node of first replacement determination unit 3100.1 attains an L level since the row address already stored in storage cell train MCR12 matches the row address of defective memory cell DBM3. Therefore, writing into storage cell train MCC11 is not carried out since write select line WEc corresponding to storage cell train MCC11 remains at the L level.

Similarly in the detection of defective memory cell DBM4, the internal address will not be written into storage cell train MCC11 since the MS node is at an L level.

At time t4 where defective memory cell DBM5 is detected as represented in FIG. 7, none of the internal row address and internal column address already stored in the storage cell train match the internal address of defective memory cell DBM5. Therefore, the internal column address of defective memory cell DBM5 is written into storage cell train MCC11.

At respective detections of defective memory cells DBM6 and DBM7, the column address already stored in storage cell train MCC11 matches the column address of defective memory cells DBM6 and DBM7. Therefore, write select signal WEd towards storage cell train MCC12 is not rendered active, and the internal address is not written into storage cell train MCC12.

At time t5 when defective memory cell DBM8 is detected, the column address of defective memory cell DBM8 does not match the internal address already stored in memory cell columns MCR11, MCR12, MCC11. Therefore, column address CF8 of defective memory cell DBM8 is written into storage cell train MCC12.

Even when all the defective memory cells in the memory array have been detected (at the time of test completion), the output level of flip-flop circuit 3210 of first replacement determination unit 3100.1 is not set by the above operation.

The operations of second replacement determination unit 3100.2—sixth replacement determination unit 3100.6 are similar to that of first replacement determination unit 3100.1, provided that the connected storage cell train and the sequence of row or column determination differ from those of first replacement determination unit 3100.1.

Also, it is to be noted that the address written into each memory cell column and whether the output of flip-flop circuit 3210 is set or not at the time of detecting the eighth defective memory cell DMB8 differ according to each replacement determination unit.

When the test ends, BIST control unit 2010 reads out repair fail signal RF corresponding to the value of flip-flop circuit 3210 in first replacement determination unit 3100.1 to sixth replacement determination unit 3100.6. The value stored in the storage cell train connected to any of first to sixth replacement determination units 3100.1–3100.6 having a repair fail signal RF of an L level and that holds a valid value, i.e. the storage cell train corresponding to any of nodes MVa, MVb, MVc, and MVd having an H level, represents the address to be replaced. In the above example, a replacement process by a spare row and a spare column is to be carried out according to the address stored in the storage cell train corresponding to first replacement determination unit 3100.1 or the value stored in the storage cell train connected to fifth replacement determination unit 3100.5.

In the above-described structure of BIST circuit 2000, the circuit scale can be suppressed at a low level even if the memory capacity of the under-measurement semiconductor memory device is increased. Thus, there is the advantage that incorporation into a semiconductor memory device is facilitated.

The above description is provided corresponding to two spare rows and two spare columns. However, the number of spare rows and spare columns is not limited to 2. When the number of the spare rows and spare columns is increased, a replacement determination unit corresponding to the number of the increased combinations is to be provided. Also, a row address storage unit and a column address storage unit corresponding thereto are to be provided.

The first embodiment is described corresponding to a structure in which BIST circuit 2000 is provided in a semiconductor memory device. The present invention is not limited to this application. For example, in the case where a semiconductor memory device is integrated together with, for example, a logic circuit on one chip, a structure can be implemented in which BIST circuit 2000 is provided to test this semiconductor memory device.

[Structure of Reading Out Data of a Plurality of Bits Per Memory Cell Array]

(Problems in the structure of reading out data of a plurality of bits per memory cell array)

Figure 8:
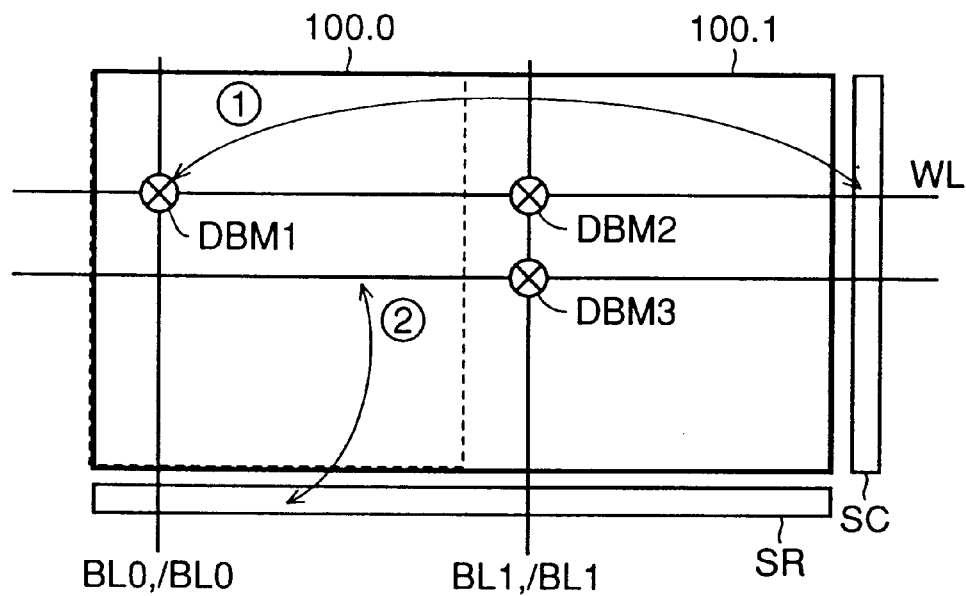
FIG. 8 is a diagram to describe the concept of a replacement operation by a redundant memory cell array when a memory cell array 100 is divided into two sub memory arrays.

FIG. 8 is a diagram to describe the concept of the replacement operation by a redundant memory cell array when a memory cell array 100 is divided into the two sub memory arrays of 100.0 and 100.1.

FIG. 8 corresponds to the case where data are read out at the same time from bit lines BL0, /BL0 of sub memory cell array 100.0 and bit lines BL1, /BL1 of sub memory cell array 100.1 when word line WL is rendered active.

In such a configuration, problems set forth in the following are noted when the above-described redundant memory cell array replacement is carried out.

When replacement by a redundant memory cell is to be carried out in the order of redundant memory cell column→redundant memory cell row, and memory cells DBM1 and DBM2 belonging to the same memory cell row are both defective memory cells, defective memory cell DBM1 thereof can be replaced by a redundant memory cell column SC.

However, two memory cell columns cannot be replaced simultaneously according to the structure of semiconductor memory device 1000 described with reference to FIG. 1. In the case where a memory cell column including defective memory cell DBM1 is replaced with a redundant memory cell column SC, and then a defective memory cell DBM3 belonging to a memory cell row differing from that of defective memory cell DBM1 is detected, the memory cell row that includes defective memory cell DBM3 is replaced by redundant memory cell row SR.

However, this replacement process is disadvantageous in that defective memory cell DBM2 cannot be repaired. Furthermore, BIST circuit 2000 will erroneously determine that memory cells DBM1 and DBM2 have both been repaired although defective memory cell DBM2 is not actually repaired since defective memory cell DBM1 designated by the same row address and same column address has been repaired.

Figure 9:
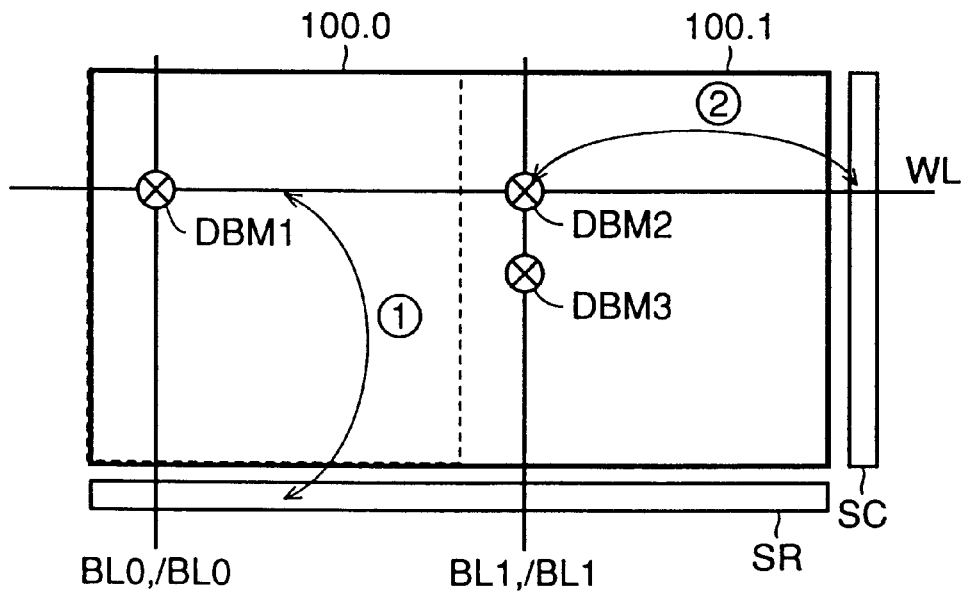
FIG. 9 is a diagram representing the concept of a process of replacement with a redundant memory cell row SR, followed by replacement with a redundant memory cell column SC.

FIG. 9 is a diagram showing the concept of the process carrying out replacement by redundant memory cell row SR, and then replacement by redundant memory cell column SC.

In this case, defective memory cells DBM1 and DBM2 are repaired simultaneously by replacement with redundant memory cell row SR. Therefore, defective memory cells DBM1–DBM3 are all repaired by replacing the memory cell column where defective memory cell DBM3 belongs to with redundant memory cell column SC at the time point when defective memory cell DBM3 belonging to a memory cell row differing from that of defective memory cell DBM1 is detected.

Since BIST circuit 2000 determines that all memory cell columns have been repaired, signal CS1-RF in circuit 3100.1 indicates a repairable status.

In the case where data are read out simultaneously from a plurality of memory cells (for example two memory cells) according to activation of one word line when memory cell array 100 is divided into two sub memory cell arrays 100.0 and 100.1, there is a possibility that the determination of whether repair has been carried out by a redundant memory cell array cannot be made properly according to the structure of BIST circuit 2000 described with reference to FIGS. 1–5.

[Structure of Reading Out Data of a Plurality of Bits at One Time from Memory Cell Array]

Recently, there are cases where the logic circuit and the semiconductor memory device are incorporated on one chip for the purpose of improving the performance of data processing. In such cases, the logic circuit and the semiconductor memory device are generally connected through a bus of a large data width taking advantage of the fact that the logic circuit and the semiconductor memory device are integrated on the same chip.

Therefore, there is the case where data of a plurality of bits, for example data of one page, are read out at one time together from the memory cell array to be transferred with respect to the logic circuit.

In this case, not all the defective bits can be replaced with the structure of BIST circuit 2000 shown in FIG. 1.

Figure 10:
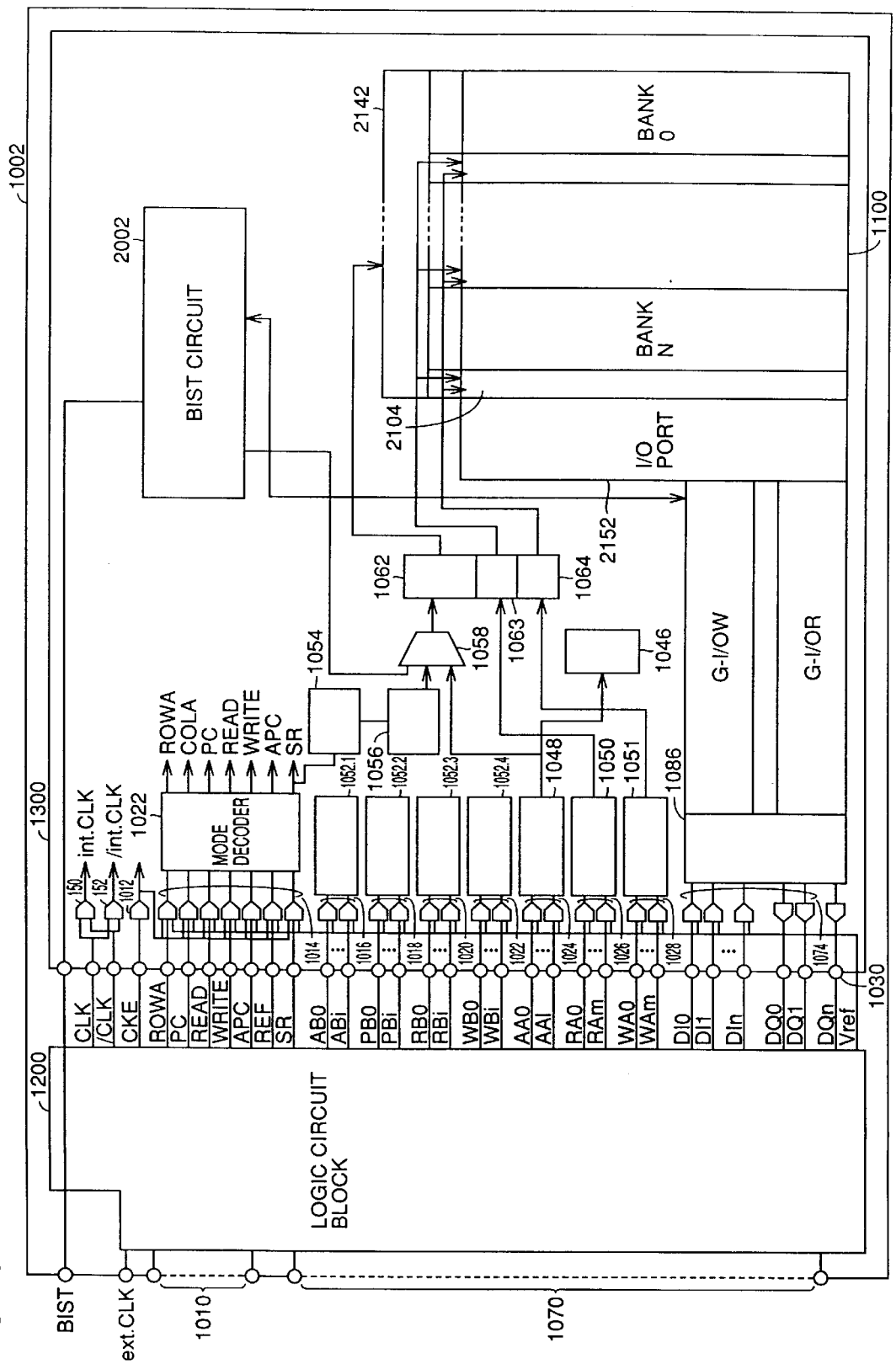
FIG. 10 is a schematic block diagram showing a structure of a semiconductor memory device 1002 having a logic circuit and a semiconductor memory device integrated on one chip.

FIG. 10 is a schematic block diagram showing a structure of a semiconductor memory device 1002 having the logic circuit and the semiconductor memory device integrated on one chip.

Referring to FIG. 10, semiconductor memory device 1002 mainly includes a logic circuit block 1200 and a semiconductor memory device block 1300.

Logic circuit block 1200 carries out a predetermined operation based on an externally applied control signal via a control signal input terminal 1010 and data applied via a data input/output terminal 1070, and stores the intermediate process or final result in semiconductor memory device block 1300.

Semiconductor memory device block 1300 includes a BIST circuit 2002 to carry out testing on memory cell array 1101 based on test data writing and reading in a test operation.

As will be described afterwards, BIST circuit 2002 differs from BIST circuit 2000 of FIG. 1 in the structure of a comparator 2060 to detect a defective bit, and a BIST control unit 2010 to control the operation of the built-in self testing. The remaining components are basically similar.

Semiconductor memory device block 1300 further includes clock input buffers 150 and 152 receiving and buffering complementary clock signals CLK and /CLK which are the converted version of external clock signal ext.CLK applied via clock input terminal 1002 in logic circuit block 1200, and providing complementary internal clock signals int.CLK and /int.CLK, and a mode decoder 1022 receiving the control signal applied from logic circuit block 1200 in synchronization with internal clock signal int.CLK.

The control signals applied from logic circuit block 1200 to semiconductor memory device block 1300 include a signal CKE, a signal ROWA to designate activation of a row related operation, a signal PC to designate a precharge operation, a signal READ to designate a readout operation, a signal WRITE to designate a write operation, a signal APC to designate an auto precharge operation, a signal REF to designate a refresh operation, and a signal SR to designate a self refresh mode.

Signal CKE serves to designate that input of a control signal to semiconductor memory device block 1300 is allowed. The aforementioned control signals cannot be applied to mode decoder 1022 unless this signal is rendered active.

The input of such control signals into mode decoder 1022 is under control of a control signal input buffer group 1014 receiving the output of internal control signal input buffer 1012 that receives signal CKE to be rendered active.

Semiconductor memory device block 1300 further includes an active bank latch circuit 1052.1 receiving via input buffer 1016 and storing a bank address output from logic circuit block 1200 to designate a bank to be rendered active for a write or read operation, a precharge bank latch circuit 1052.2 receiving and storing a precharge bank address applied from logic circuit block 1200 via input buffer 1018 to designate a bank that is to be subjected to a precharge operation, a readout bank latch 1052.3 receiving via input buffer 1020 and storing a readout bank address from logic circuit block 1200 to designate a bank that is to be subjected to a readout operation, a write bank latch 1052.4 receiving via input buffer 1022 and storing a write bank address signal from logic circuit block 1200 to designate a bank that is to be subjected to a write operation, a row address latch circuit 1048 receiving via input buffer 1024 and storing a row address signal applied from logic circuit block 1200 in a write or read operation, a read address latch 1050 receiving via input buffer 1026 and storing a column address from logic circuit block 1200 in a readout operation, and a write address latch 1051 receiving via input buffer 1028 and storing a column address from logic circuit block 1200 in a write operation.

Mode decoder 1022 outputs an internal control signal to control the operation of the circuit in semiconductor memory device block 1300 according to an applied control signal. For example, mode decoder 1022 outputs signals ROWA, COLA, PC, READ, WRITE, APC and SR as internal control signals. Signal ROWA indicates that row related access is to be carried out. Signal COLA indicates that column related access is to be carried out.

Signal PC serves to designate a precharge operation, and designate the end of a row related circuit operation. Signal READ serves to designate a readout operation with respect to column related circuitry. Signal WRITE serves to designate a write operation with respect to column related circuitry.

Signal APC serves to designate an auto precharge operation. When an auto precharge operation is specified, a precharge operation is initiated automatically following the end of a burst cycle. Signal SA serves to designate a self refresh operation. Upon initiation of a self refresh operation, a self refresh timer operates to render active a word line at an elapse of a predetermined time to initiate a refresh operation.

Semiconductor memory device block 1300 further includes a self refresh timer 1054 initiating a self refresh mode, when specified by signal SR, to render active a word line at an elapse of a predetermined time, i.e. to designate initiation of a refresh operation, and a refresh counter 1056 to generate an address corresponding to a refresh operation according to designation from self refresh timer 1054.

Semiconductor memory device block 1300 further includes a reference potential input node 1030 receiving from logic circuit block 1200 a signal VRF that becomes the reference of determination of an H level or an L level of the input signal, a mode register 1046 receiving the output from row address latch circuit 1048 to retain a signal specifying an operation mode of semiconductor memory device block 1300, a multiplexer 1058 receiving outputs from BIST circuit 2022, refresh address counter 1056 and row address latch 1048 to select the output of row address latch 1048 in a general operation, the output from refresh address counter 1056 in a self refresh operation, and the output of BIST circuit 2002 in a test mode for output, a row predecoder 1062 receiving the output from multiplexer 1058 to predecode a row address, a predecoder 1063 receiving the output from read address latch 1050 to predecode a column address for a readout operation, and a predecoder 1064 receiving the output from write address latch 1051 to predecode a column address for a write operation.

Semiconductor memory device block 1300 further includes a memory cell array 1100 with a plurality of banks corresponding to the unit in which a read/write operation can be effected individually, a main decoder 2142 to select a line (word line) in a corresponding bank based on the output from row activation bank latch 1052 and the output of row predecoder 1062, a row decoder group 2143 receiving the output from predecoder 1062 to select a corresponding row, a main column decoder 2104 to select a column (bit line pair) in the corresponding bank according to the output from column predecoder 1063 or 1064, an I/O port 2152 to apply data read out from a selected memory cell in the selected bank to a read global I/O bus G-I/OR in a readout operation, and applying write data transmitted through a bus G-I/OW to a corresponding bank, a data input/output circuit 1086 retaining externally applied write data and providing the retained data to bus G-I/OW in a write operation, and retaining read data transmitted through bus G-I/OR in a readout operation, and a data output buffer group 1074 to transfer input data DI0–DIn and read data DQ0–DQn between data input/output circuit 1086 and data input/output node 1072.

Figure 11:
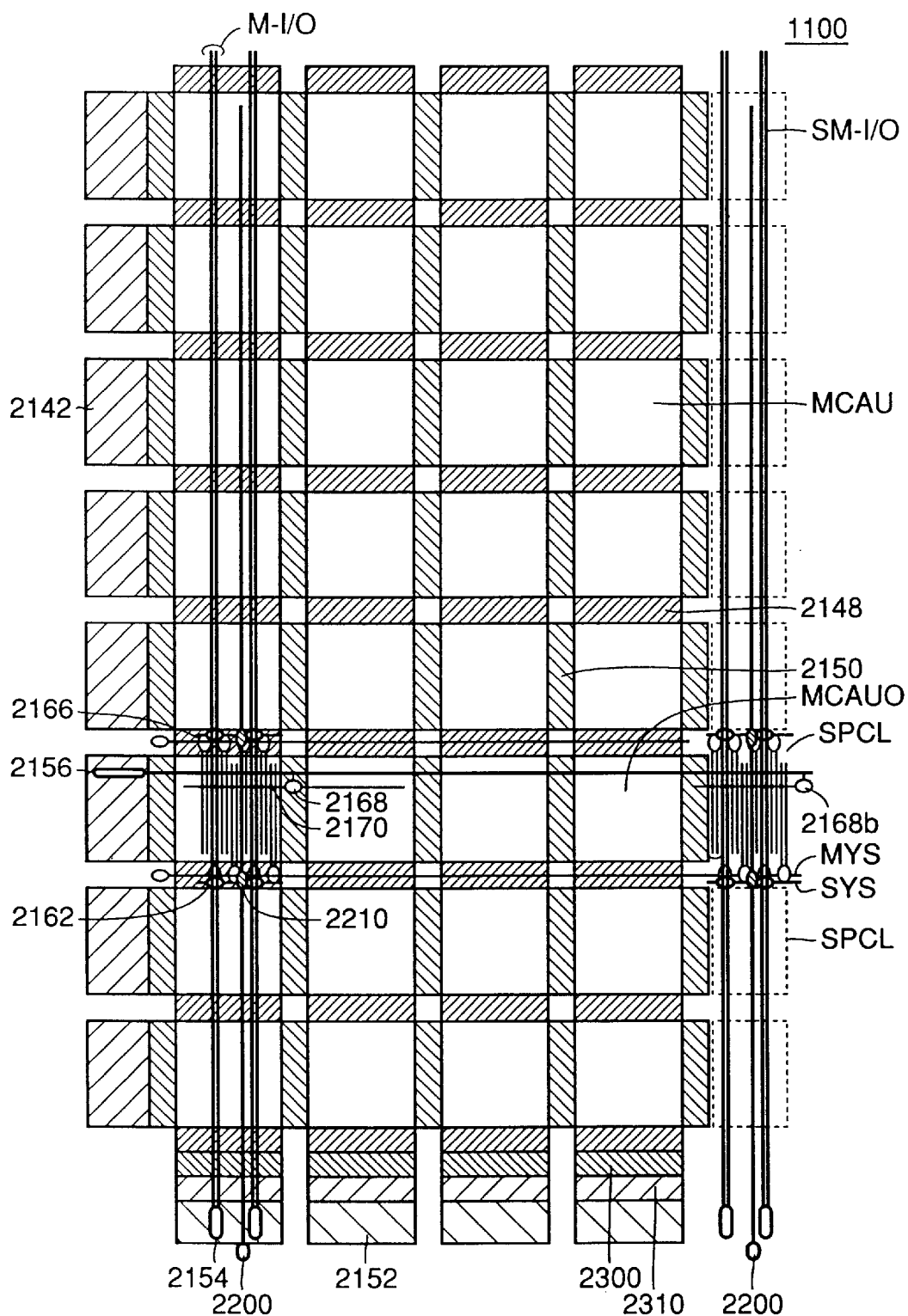
FIG. 11 is a schematic block diagram showing a structure of a memory array 1100.

FIG. 11 is a schematic block diagram showing a structure of memory array 1100.

In memory cell array 1100 of FIG. 11, a segment YS line has a hierarchical structure so as to control gate circuit 2162 that selectively opens/closes the connection between a sense amplifier amplifying the potential level in the column direction, i.e. the bit line pair connected to the selected memory cell and the main I/O line pair.

More specifically, by a sub YS decoder 2210 controlled according to the level of the main segment YS line SGYS arranged along the row direction and the signal from the YS segment decoder, sub YS line is rendered active, which in turn controls gate circuit 2162.

In memory cell array 1100, the redundancy structure in the row direction is arranged together at a row redundancy unit 2300 disposed at the end of the memory cell array.

The column direction redundancy structure is provided at a spare column region SPCL which is a region separate from the subdivided memory cell array unit MCAU.

In FIG. 11, only the structure of the redundant column arranged immediately to the right of one memory cell array unit MCAU0 is shown. In practice, a similar structure is arranged along sub I/O line pair SM-I/O.

Furthermore, a structure in which a memory cell array unit MCAU is arranged symmetrically about redundant column region SPCL can be employed.

Similarly in the redundant column region, a sub word line SWL is rendered active according to a sub word driver 2168b that is rendered active in response to activation of main word line MWL and activation of a bank select line, similar to a normal memory cell array unit region MCAU.

Furthermore, gate circuit 2210b selectively controlling the connection between a selected memory cell column in the redundant column region and sub I/O line pair is under control of a hierarchical segment YS line, similar to the normal memory cell array unit region.

Figure 12:
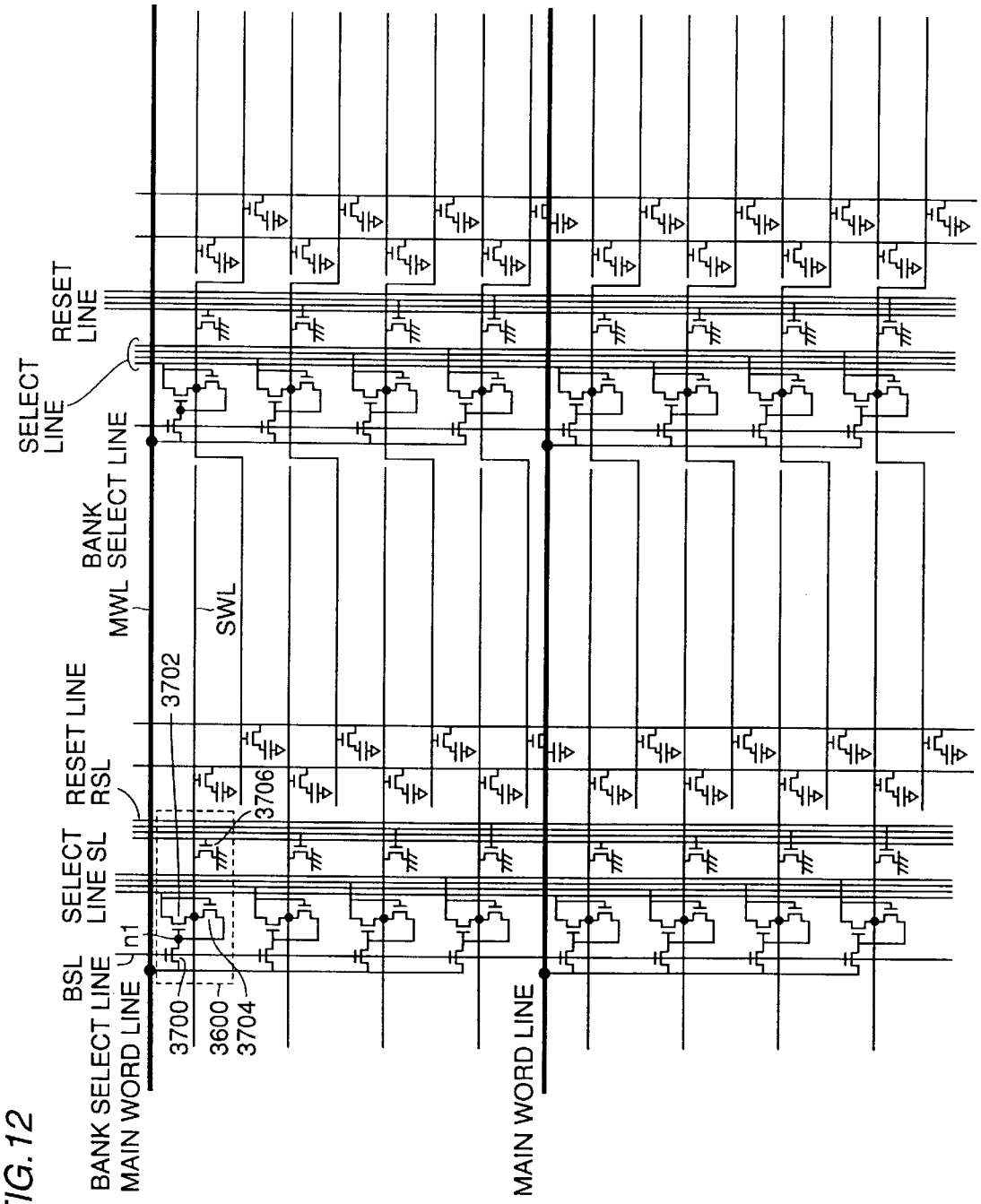
FIG. 12 is a circuit diagram to show in detail a structure of the sub word driver band of FIG. 11.

FIG. 12 is a circuit diagram showing in detail the structure of the sub word driver band of FIG. 11.

Driver circuit 3600 further includes a select transistor 3700 having a gate under control of a bank select line BSL, and provided between a main word line and an internal node n1, a transistor 3702 having its gate connected to node n1, and connected between one select line SL0 of select lines SL and a sub word line SWL, and a transistor 3704 having its gate potential under control of a select line SL0 identical to that of transistor 3702, and connected between sub word line SWL and node n1. Driver circuit 3600 further includes a transistor 3706 having its gate potential controlled by reset line RSL0, and provided between a sub word line and the ground potential.

A similar structure is present for the other main word lines and sub word lines.

By such a structure, a main word line MWL is rendered active, and a corresponding word line SWL is set to an active status (high potential) in response to activation of a bank select line BSL and activation of any select line SL. By the selective activation of reset line RSL, a corresponding sub word line SWL is discharged to the level of the ground potential.

In the example shown in FIG. 12, one main word line MWL controls four sub word lines SWL in each bank. Specification of which sub word line SWL is to be selected is made by rendering active one of select lines SL.

Bank select line BSL attains the level of boosted voltage Vpp when active, and attains the level of ground potential Vss following activation of sub word line SWL. In this case, the activation status of bank select line BSL is retained by the latch circuit formed of transistors 3702 and 3704. Control is provided so that the potential levels of select line SL and reset line RSL are complementary to each other.

In a standby operation, bank select line BSL is at the level of ground potential (GND), select line SL is at the level of ground potential (GND), and reset line RSL is at the level of the power supply potential (Vcc).

In an activation operation, the corresponding reset line is driven to the ground potential (GND), and bank select line BSL corresponding to sub word line SWL to be rendered active is rendered active so that the potential level thereof corresponds to the level of boosted potential Vpp.

Then, main word line MWL is rendered active to attain the level of power supply potential (Vcc). Substantially simultaneous to activation of main word line MWL, one of select lines SL attains the level of power supply potential (Vcc), and sub word line SWL attains the level of (Vcc-Vth). Then, bank select line BSL is driven to the level of ground potential (GND), so that charge is confined in the latch circuit of the driver circuit.

By driving the selected one potential level of select signals SL up to the level of boosted potential (Vpp) under the state where the charge is confined by transistors 3702 and 3704, the level of sub word line SWL is altered to the level of boosted potential (Vpp).

In a reset operation, the bank select line is driven to the level of power supply potential (Vcc) and select line SL is driven to the level of ground potential (GND). Furthermore, by driving the reset line to the level of power supply potential (Vcc), the charge stored in sub word line SWL is discharged.

By the above structure, sub word line driver 3000 can be formed of only four elements of N channel MOS transistors. Therefore, the number of elements forming sub word line driver 3000 can be reduced.

Furthermore, the main word line is rendered active with a one shot pulse signal. More specifically, once the active state of a main word line is held by transistors 3702 and 3704 in sub word driver 3000 corresponding to the selected sub word line, the potential level of the main word line will be reset.

Figure 13:
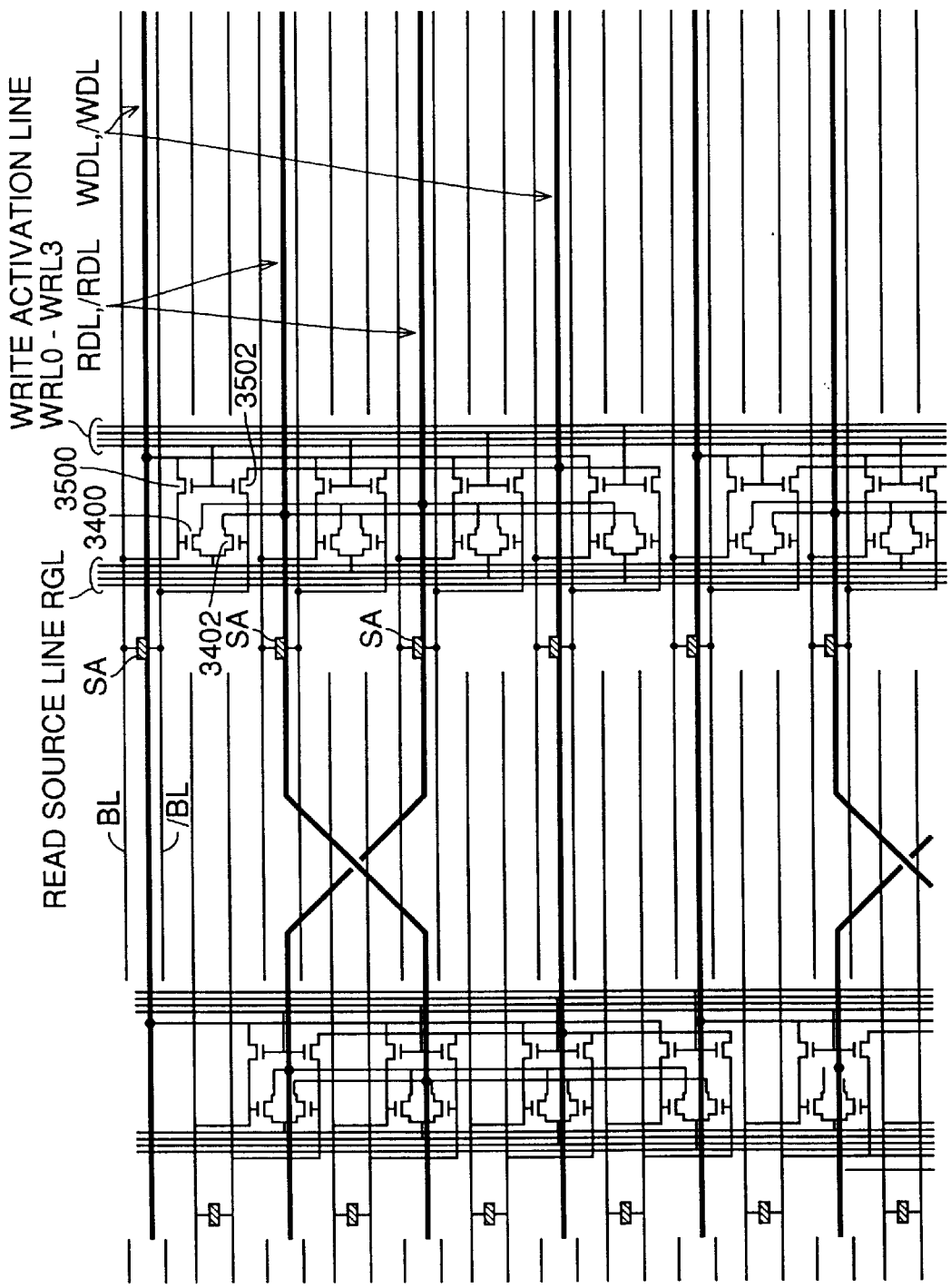
FIG. 13 is a circuit diagram showing a structure for connection between a sense amplifier SA and a data line portion.

FIG. 13 is a circuit diagram showing a structure of effecting connection between sense amplifier SA and the data line portion.

As shown in FIG. 13, data line pairs RDL, /RDL for reading (generically referred to as RDLP hereinafter) and a data line pair WDL, /WDL for writing (generically referred to as WDLP) are provided individually.

A data signal is transmitted from the input/output node of sense amplifier SA to read data line pair RDL, /RDL via transistors 3400 and 3402 receiving the readout signal at their gates.

More specifically, transistors 3400 and 3402 have their sources selectively set to the ground potential by a read source line RGL, their gates connected to the input/output node of respective corresponding sense amplifiers SA, and their drains connected to a corresponding read data line pair RDL, /RDL.

In the structure shown in FIG. 13, four sense amplifiers share one data line pair RDL, /RDL.

Data line pairs WDL, /WDL are selectively connected to bit lines BL and /BL by transistors 3500 and 3502 respectively connected between a corresponding bit line BL and data line WDL and between bit line /BL and a corresponding data line /WDL in a write operation.

Segment YS shown in FIG. 11 includes a read source line RGL (generic reference of read source lines RGL0–RGL3), a write activation line WRL (generic reference of write activation lines WRL0–WRL3), and the like.

Figure 14:
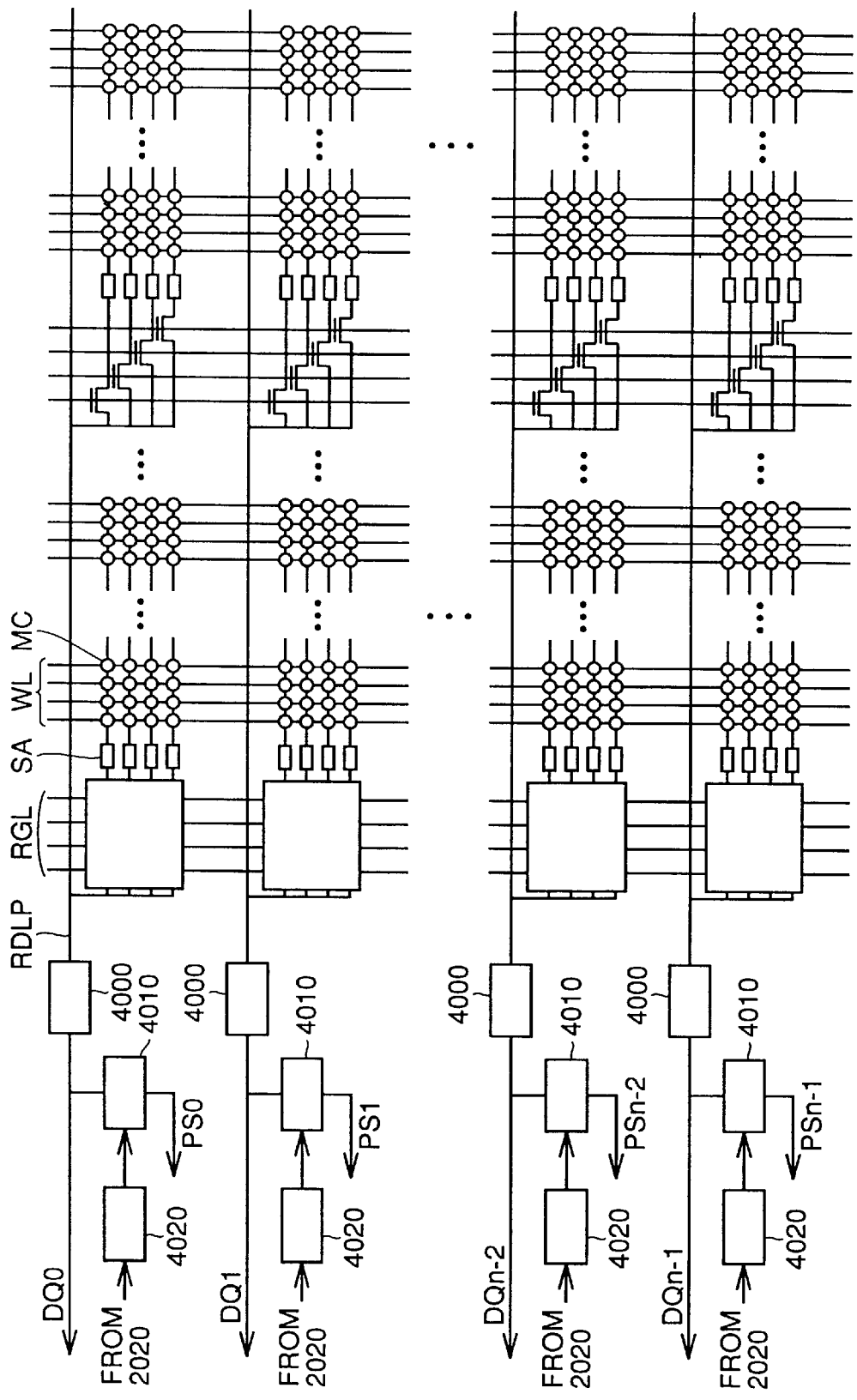
FIG. 14 is a diagram representing the concept of the structure to compare a plurality of read data and the expected value.

FIG. 14 shows the concept of the structure to compare a plurality of read data with the expected value.

According to the structure of FIG. 14, n data are read out at one time to I/O bus.

The data read out from memory cell MC by the activation of word line WL is amplified by sense amplifier SA. The data selected by read source line RGL is read out to I/O line pair RDLP for reading.

The data read out to read I/O line pair RDLP is amplified by preamplifier 4000 to be applied to logic circuit block 1200 via data input/output circuit 1086 in a normal operation.

In a built-in self test mode, the data amplified by preamplifier 4000 is applied to match detection circuit 4010 to be compared with the value in expected value latch circuit 4020 that retains the expected value in a read operation. The comparison result is output as match detection signals PS0–PSn−1.

For the sake of simplification, description will be provided assuming that there are sixteen data read out at one time.

It is to be noted that more data are read out at one time from the memory cell array in semiconductor integrated circuit device 1002 in practice, as described with reference to FIG. 10.

[Structure of Detecting Defective Bit]

Determination of the test result is made with a matrix of match detection signals PS0–PS15 in 4×4 corresponding to the sixteen data read out at one time in FIG. 14. As will be described hereinafter, the arrangement of the sixteen match detection signals in 4 rows and 4 columns can be altered appropriately so as to facilitate identification of a defective bit. The same applies to n×n match detection signals.

Figure 15:
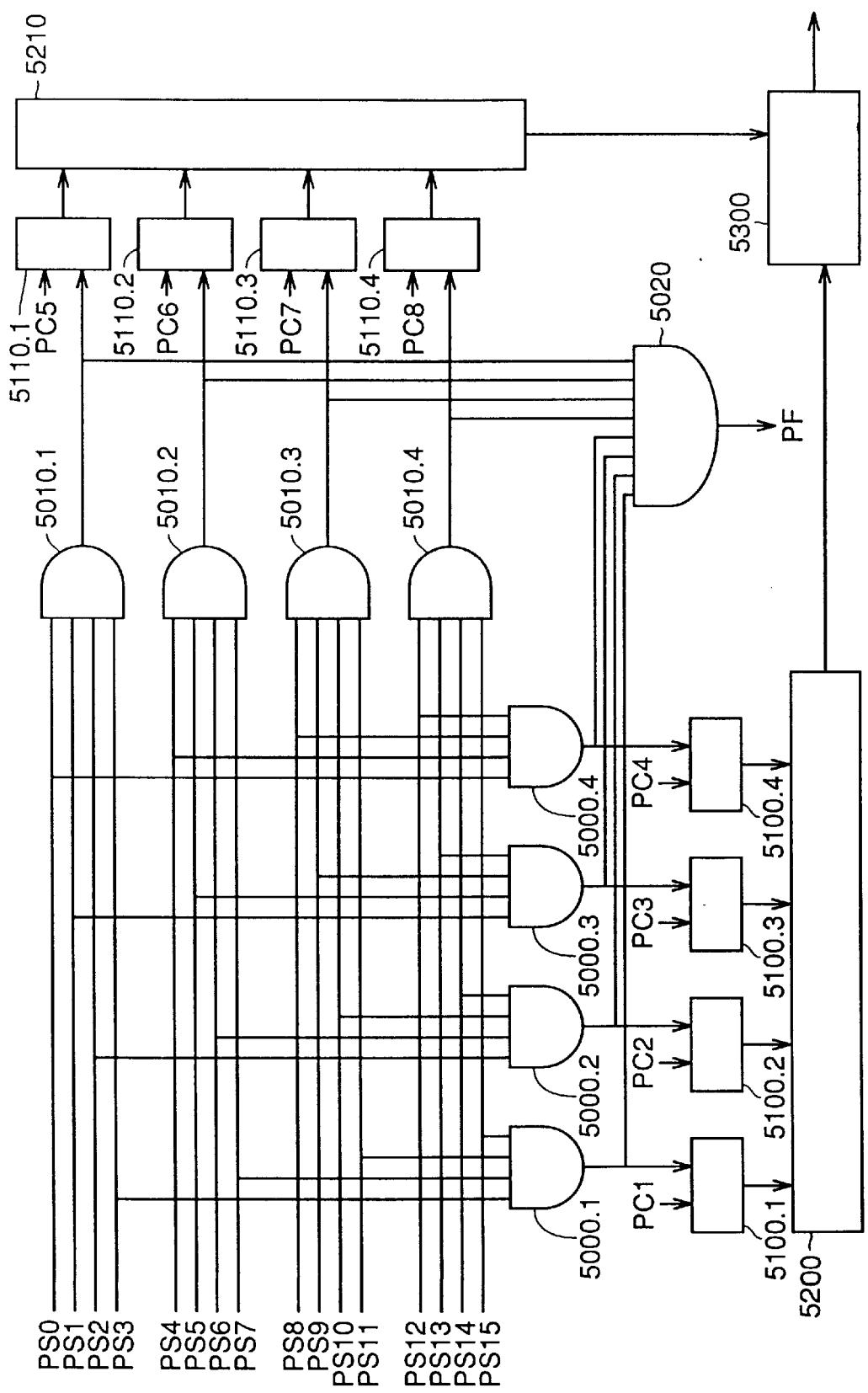
FIG. 15 is a schematic block diagram to describe a structure of a defective number detection circuit to detect the number of defective bits.

FIG. 15 is a schematic block diagram to describe the structure of a defective number detection circuit detecting matching of the data read out at one time to identify the number of defective bits.

Referring to FIG. 15, an AND circuit 5000.1 receives signals PS3, PS7, PS11 and PS15 to output the result of the operation of the logical product. AND circuit 5000.2 receives signals PS2, PS6, PS10 and a signal PS14 to calculate a logical product thereof and output the result. AND circuit 5000.3 receives signals PS1, PS5, PS9 and PS13 to output the result of the operation of the logical product. An AND circuit 5000.4 receives signals PS0, PS4, PS8 and PS12 to output the result of the operation of the logical product.

AND circuit 5010.1 receives signals PS0–PS3 to output the operated result of the logical product. AND circuit 5010.2 receives signals PS4–PS7 to output the calculated result of the logical product. AND circuit 5010.3 receives signals PS8–PS11 to output the calculated result of the logical product. AND circuit 5010.4 receives signals PS12–PS15 to output the calculated result of the logical product.

AND circuit 5020 receives the outputs of AND circuits 5000.1–5000.4 and 5010.1–5010.4 to output the calculated result of the logical product.

When the expected value matches the read out data, signals PS0–PS15 attain an H level. When all the sixteen read out data match the expected value, the signal output from AND circuit 5020 attains an H level.

As will be described afterwards, the result of the parity check for the respective four signals in the vertical direction and horizontal direction for signals PS0–PS15 for the process of a matrix of 4×4 is generated as signals PC1–PC8.

Therefore, defective number detection circuit 5100.1 receives a signal PC1 which is the signal indicating the parity check result of signals PS3, PS7, PS11 and PS15 and the output of AND circuit 5000.1 to output the estimated result of the defective number of bits.

The same applies for the other defective number detection circuits 5100.2–5100.3.

Defective number detection circuit 5110.1 receives a signal PC5 indicating the parity check result of signals PS0–PS3 and the output of AND circuit 5010.1 to output the estimated result of the number of defective bits.

The same applies for the other defective number detection circuits 5110.2–5110.4.

A defective number adder circuit 5200 receives the outputs of defective number detection circuits 5100.1–5100.2 to add the detected number of defective bits. A defective number adder circuit 5210 receives the result of the defective number detection from defective number detection circuits 5110.1–5110.4 to output the added result.

Defective bit number determination circuit 5300 receives the outputs of defective number adder circuits 5200 and 5210 to output the maximum values of the outputs as the eventual number of defective bits.

Figure 16:
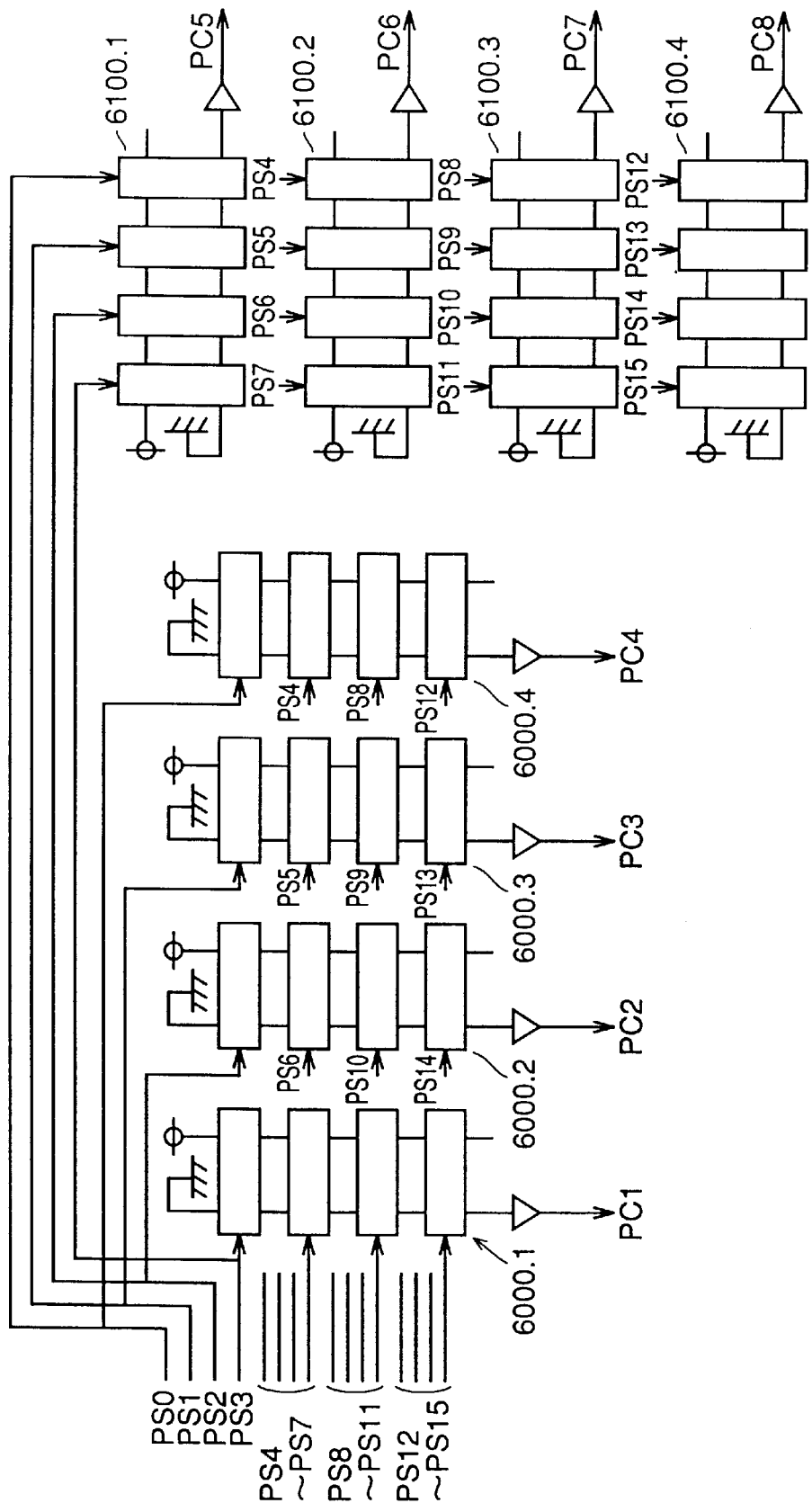
FIG. 16 is a schematic block diagram to describe a structure of a parity check circuit.

FIG. 16 is a schematic block diagram to describe the structure of the parity check circuit of FIG. 15.

Parity check circuit 6000.1 receives signals PS3, PS7, PS11 and PS15 to output a signal PS1 according to the comparison result. Similarly, parity check circuit 6000.2 receives signals PS2, PS6, PS10 and PS14 to output the result of the parity check as signal PC2.

The same applies for the other parity check detection circuits 6000.3 and 6000.4.

Similarly, parity check circuit 6200.1 receives signals PS0–PS3 to output a parity check signal PC5.

The same applies for the other parity check circuits 6100.2–6100.4.

Figure 17:
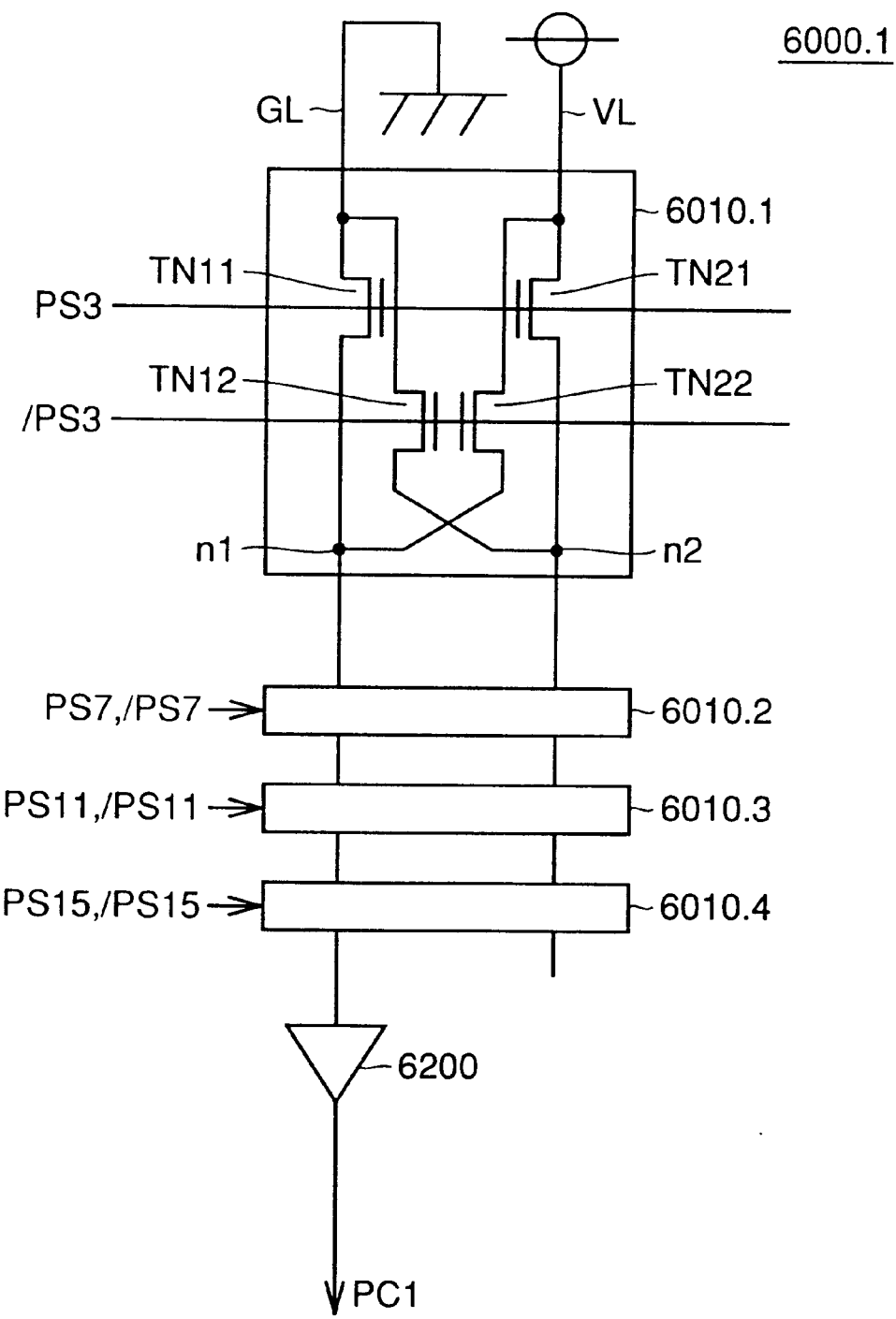
FIG. 17 is a schematic block diagram to describe a structure of a parity check circuit 6000.1.

FIG. 17 is a schematic block diagram to describe a structure of parity check circuit 6000.1 of FIG. 16.

Parity check circuit 6000.1 includes a parity circuit 6010.1 receiving signal PS3 and a signal /PS3 which is the inverted version of signal PS3, a parity circuit 6010.2 receiving a signal PS7 and an inverted signal /PS7, a parity circuit 6010.3 receiving a signal PS11 and an inverted signal /PS11, a parity circuit 6010.4 receiving a signal PS15 and an inverted signal /PS 15, and a drive circuit 6200 receiving the output of parity circuit 6010.4 to output parity check signal PC1.

The other parity determination circuits have a similar structure, provided that the input signal differs.

Parity circuit 6010.1 includes an N channel MOS transistor TN11 having a source connected to a line GL to which the ground potential is supplied and a gate receiving signal PS3, an N channel MOS transistor TN21 having a drain connected to a line VL to which power supply potential Vcc is supplied and a gate receiving signal PC3, an N channel MOS transistor TN12 connected between line GL and the source (node n2) of transistor TN21, and receiving signal /PS3 at its gate, and an N channel MOS transistor TN22 connected between line VL and the drain (node N1) of transistor TN11, receiving signal /PS3 at its gate.

The other parity circuits 6010.2–6010.4 have a similar structure. The parity circuits are cascade-connected.

When signal PS3, for example, is at an active state (H level), the level of line GL is transmitted to the drain side of transistor TN11, and the potential of line VL is transmitted to the source side of transistor TN21.

When signal PS3 is at an inactive state (L level), the potential of line GL is transmitted to the source side of transistor TN21 whereas the potential of line VL is transmitted to the drain side of transistor TN11.

More specifically, the ground potential and the power supply potential are transmitted to output nodes n1 and n2, respectively, when signal PS3 is at an active state (H level), and the power supply potential and ground potential are transmitted to output nodes n1 and n2 when signal PS3 is at an inactive state (L level), so that the output potential will be inverted.

By virtue of the cascade-connection of parity circuits 6010.1–6010.4, the level of parity check signal PC1 output from drive circuit 6200 is altered according to the number of inactive signals among signals PS3, PS7, PS11 and PS15. When the number of signals attaining an L level output among signals PS3, PS7, PS11 and PS15 is an odd number, the level of parity check signal PC1 attains an H level. When the number of L-level signals is 0 or an even number, parity check signal PC1 attains an L level.

FIG. 18 is a diagram of the concept to describe the operation of the defective number detection circuit of FIG. 15.

FIG. 18 corresponds to the case where there is no defect in the data read out at one time, and all the expected value and determination result match each other. In this case, signals PS0–PS15 all attain the H level.

Therefore, all the signals output from AND circuits 5000.1–5000.4 and AND circuits 5010.1–5010.4 attain an H level and the output of AND circuit 5020 exhibiting the logical product thereof is at an H level. In this case, the number of defective bits is determined to be 0 unconditionally.

Figure 19:
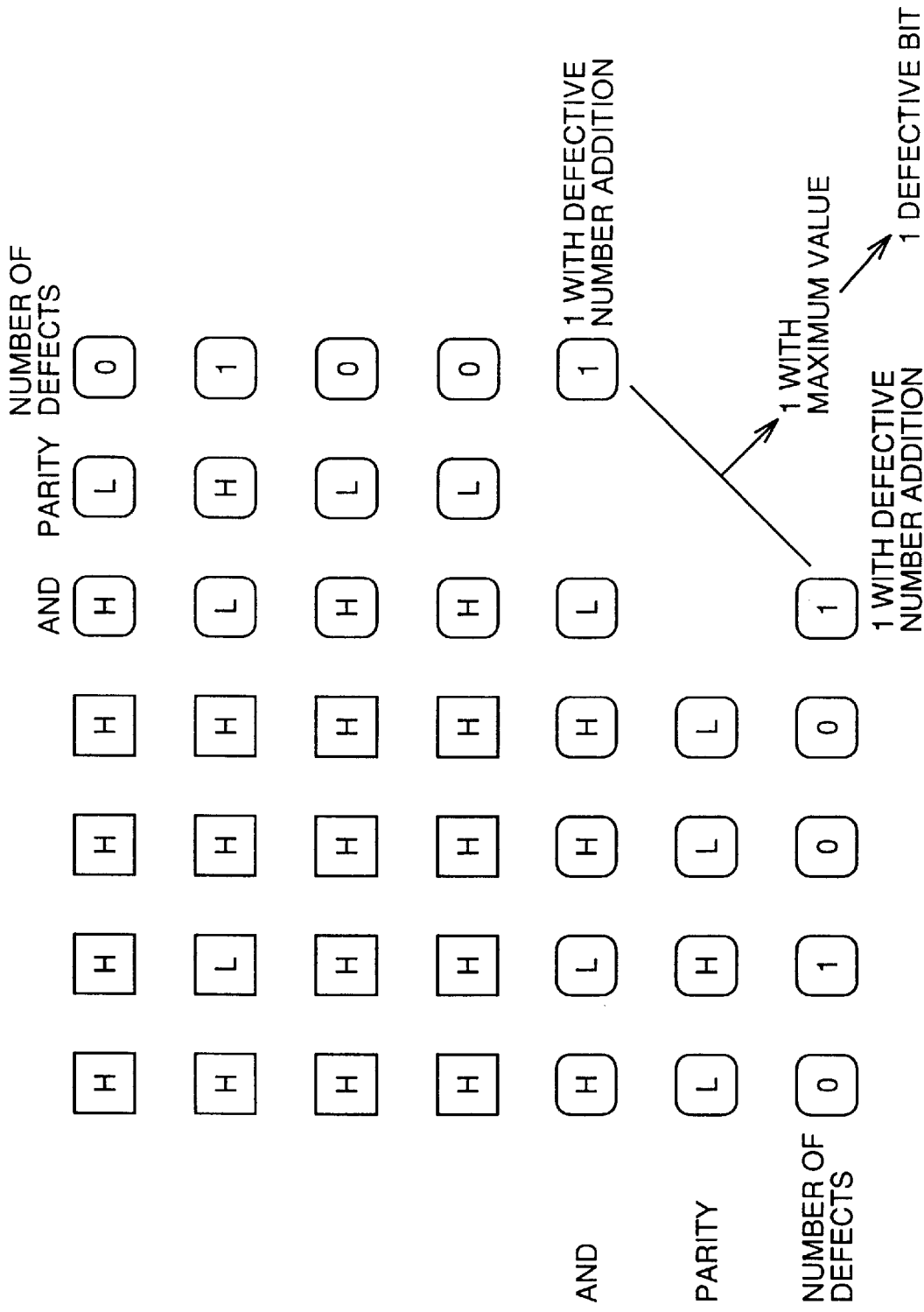
FIG. 19 is a diagram representing the concept of the operation of the defective number detection circuit when one defective data is present in the data read out at one time.

FIG. 19 shows the concept of the operation of the defective number detection circuit when there is one defective data out of the data read out at one time.

When there is a defective bit, signal PS6 attains an L level.

In this case, the output of AND circuit 5000.2 attains an L level, and similarly the output of AND circuit 5010.2 attains an L level. As a result, the output of AND circuit 5020 attains an L level, representing the presence of a defective bit.

Furthermore, the parity check results in signals PC2 and PC6 attaining an H level, and the other parity check signals attaining an L level.

Accordingly, it is presumed that the number of defective bits is 1 in defective number detection circuit 5100.2 and also in defective number detection circuit 5110.2.

As a result, defective number adder circuits 5200 and 5210 provide an output of "1". The estimated result of the number of defective bits output from defective bit number determination circuit 5300 is 1.

Figure 20:
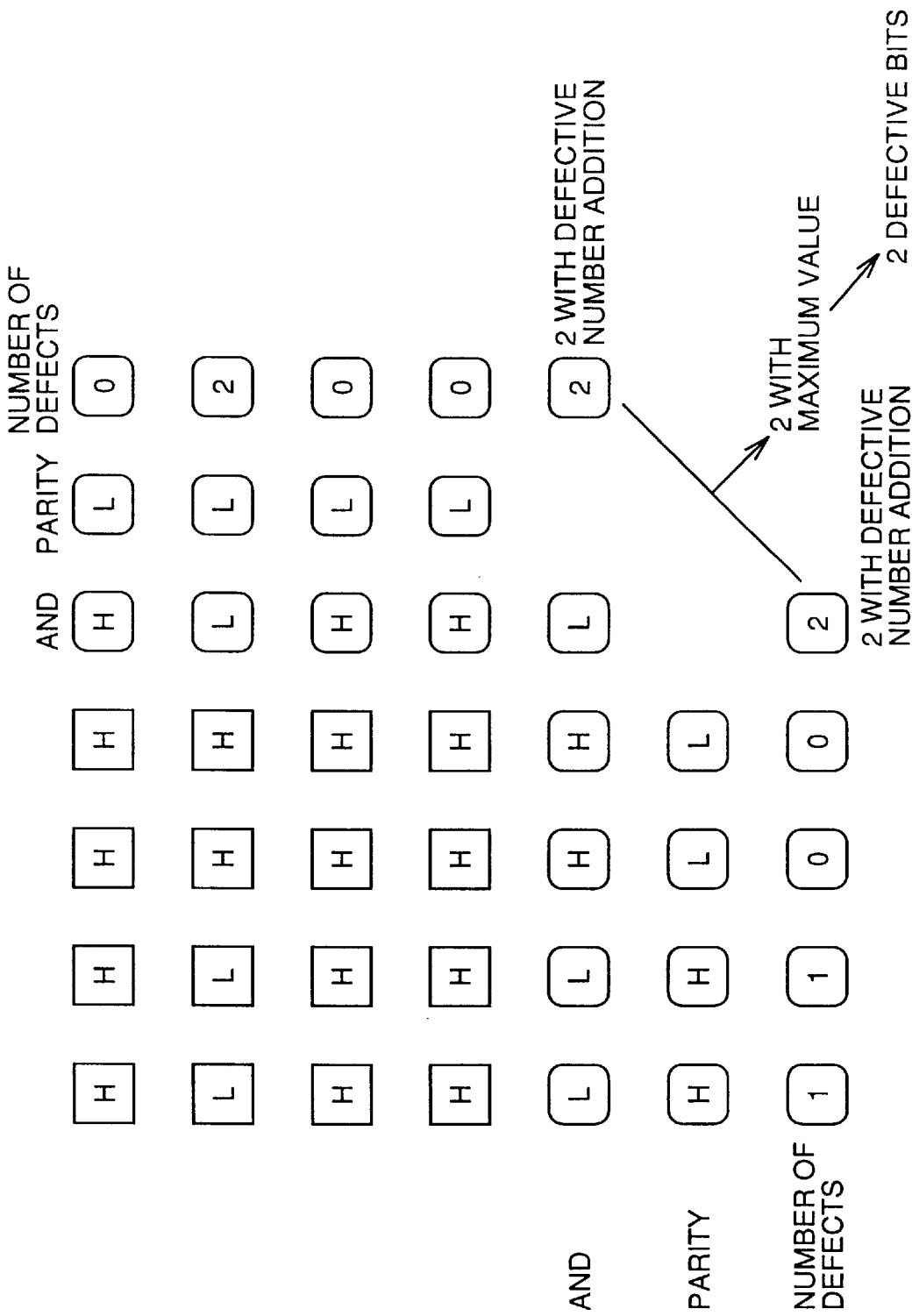
FIG. 20 is a diagram representing the concept of the operation of the defective number detection circuit when two defective data are present in the data read out at one time.

FIG. 20 is a diagram showing the concept of the operation of the defective number detection circuit when there are two defective data in the data read out at one time.

It is assumed that signals PS7 and PS6 attain an L level when there are two defective bits.

In this case, AND circuits 5000.1 and 5000.2 provide outputs of an L level. AND circuit 5010.2 provides an output of an L level. Accordingly, AND circuit 5020 provides an output of an L level, representing the presence of a defective bit.

As to the result of the parity check, signals PC1 and PC2 attain an L level whereas the other parity check signals attain an L level.

Thus, defective number detection circuits 5100.1 and 5100.2 output 1 as the estimated value of the number of defective bits, and defective number detection circuit 5110.2 outputs the detected number of defective bits as 2 in response to the output of AND circuit 5010.1 and parity check signal PC6 both attaining an L level.

As a result, defective number adder circuits 5200 and 5010 both provide an output of 2. Thus, the eventual determination result of the number of defective bits output from defective bit number determination circuit 5300 becomes 2.

Figure 21:
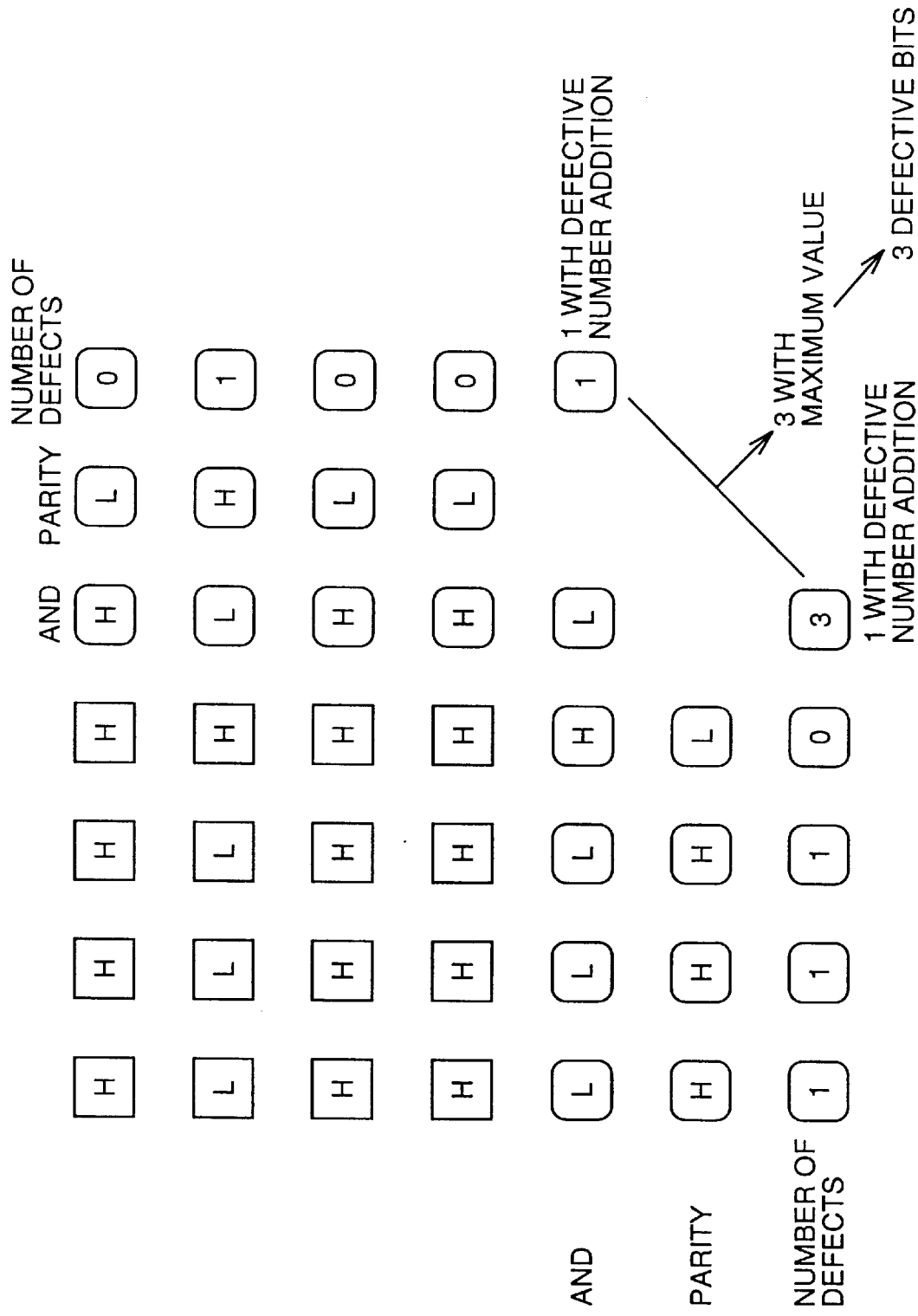
FIG. 21 is a diagram representing the concept of the operation of the defective number detection circuit when three defective data are present in the data read out at one time.

FIG. 21 is a diagram representing the concept of the operation of the defective number detection circuit when there are three defective data among the data read out at one time.

In FIG. 21, it is assumed that signals PS7, PS6 and PS5 attain an L level when there are three defective data.

In this case, AND circuits 5000.1, 5000.2 and 5000.3 provide an output of an L level. Also, AND circuit 5010.2 provides an output of an L level.

As to the parity check result, signals PC1, PC2, PC3 and PC6 attain an H level whereas the other parity check signals attain an L level.

Thus, defective number detection circuits 5100.1, 5100.2 and 5100.3 provide the output of 1 as the number of defective bits. Defective number detection circuit 5110.2 provides an output of 1 as the value of defective number detection.

As a result, defective number adder circuit 5200 provides an output of 3 as the added result of the defective number. Defective number adder circuit 5210 provides an output of 1 as the added result of the defective number of bits.

Thus, defective bit number determination circuit 5300 provides an output of 3 as the determination result of the number of defective bits.

As described above, defective number detection circuit 5100.1, for example, provides an output of 0 as the number of defective bits as long as the output of AND circuit 5000.1 is at an H level, and provides 1 as the number of defective bits when the output of AND circuit 5000.1 is at an L level and parity check signal PC1 is at an H level.

When AND circuit 5000.1 provides an output of an L level and parity check signal PC1 is at an L level, defective number detection circuit 5100.1 provides an output of 2 as the number of defective bits.

In practice, there are other combinations. However, there is no problem in practice as long as the function of determining whether the defective number is 0, 1 or 2 since a plurality of sets of spare memory cell rows and spare storage cell columns for redundancy repair are provided.

As a result of the above-described defect detection, determination is made that repair can be effected with the row spare when there are two or more defective bits in the case where there is one set of the spare memory cell train.

By configuring BIST control unit 2010 to determine that repair can be effected with the spare row when there are at least three defective bits in the case where there are two sets of the spare memory cell trains, redundancy repair can be effected even in the case where multibits are read out at one time from the memory cell array.

With regard to the address corresponding to the occurrence of the defective bit, identification can be made thereof by the crossing point where 1 or 2 is exhibited as the number of defective bits among the data arranged in the 4 columns×4 rows.

Figure 22:
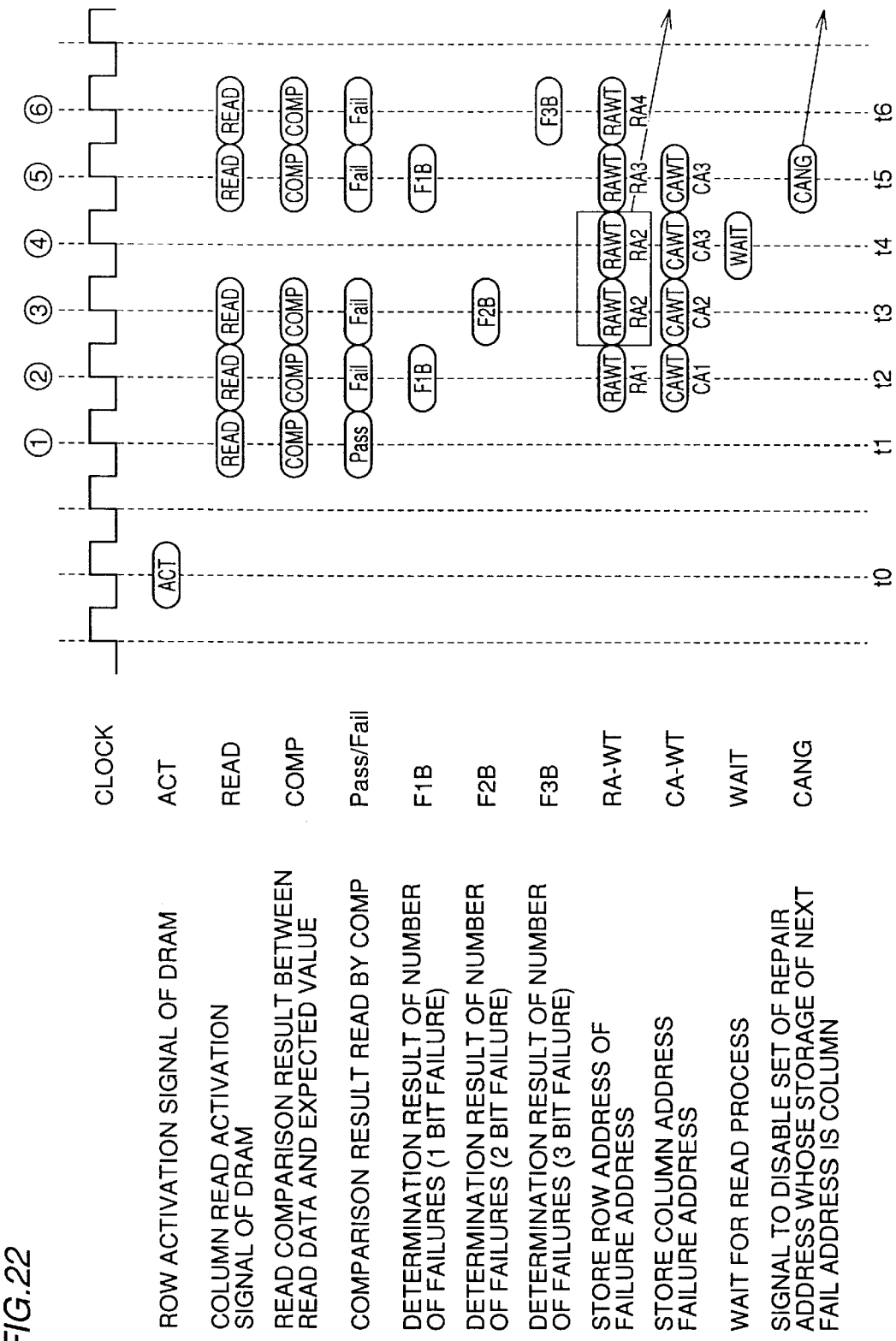
FIG. 22 is a timing chart representing the operation of the recording process of the address to be replaced.

FIG. 22 is a timing chart to describe the operation of the recording process of the address corresponding to replacement while detecting a defective bit in the built-in self test mode.

In the following, it is assumed that there are three sets of spare memory cell rows and two sets of spare memory cell columns.

Therefore, the possible combination of the sequence of carrying out redundancy replacement includes the following combination.

1) R→R→R→C→C
2) R→R→C→R→C
3) R→C→R→R→C
4) C→R→R→R→C
5) R→R→C→C→R
6) R→C→R→C→R
7) C→R→R→C→R
8) R→C→C→R→R
9) C→R→C→R→R
10) C→C→R→R→R

Referring to FIG. 22, internal control signal ACT is rendered active at time t0, whereby row related operation is rendered active. Here, it is assumed that the built-in self test mode is preset.

At time t1, signal READ and also signal COMP are rendered active simultaneously, whereby the process of comparison between the readout data and the expected data and the detection of the number of defective bits is carried out.

At time t1, it is assumed that the signal output from AND circuit 5020 is at an H level, corresponding to the determination that the number of defective bits is 0.

At time t2, 1 defective bit is detected among the readout data. Here, AND circuit 5020 provides an output of an H level and defective bit number determination circuit 5300 provides an output of the defection result that the number of defective bits is 1.

Accordingly, row address RA1 and column address CA1 used in the readout operation are stored in the storage cell train.

At time t3, detection is made of two defective bits. At time t3 and t4, the address of the two defective bits are stored in the storage cell train.

More specifically, the phase address is sequentially stored into the storage cell train over the period of two cycles when 2-bit feed determination is made.

It is to be noted that, in storing the address of the second bit, the row address is not written into the storage cell train corresponding to the combination in which the row address is already written since the row address is identical to the row address of the first bit that is already stored.

At time t5, only the repair with the row address can be effected when three or more defective bits are detected. Therefore, the BST control circuit determines that repair is not possible as to the sets having a replacement address target corresponding to a column address.

FIG. 23 is a diagram to describe the manner of the detected defective address stored corresponding to each replacement sequence at time t2.

Row address RA1 or CA1 is stored in the combination where replacement is carried out first with a spare row and the combination where replacement is effected with the spare column.

FIGS. 24 and 25 are diagrams to showing the concept of the manner of storing the defective address at time t3 and t4.

In FIG. 24, defective address RA2 or CA2 is stored. In FIG. 25, the row address is not stored for the combinations in which RA2 is already stored. It is to be noted that defective column address CA3 is stored in the storage cell train in the sequence where the column address is stored.

FIGS. 26 and 27 are diagrams to describe the concept of the manner of storing newly detected defective addresses RA3 and CA3 in the storage cell train at time t5.

When a column address is to be input identical to that already stored, the column address will not be stored in the case of the combination corresponding to the sequence of storing a column address.

Since three defective bits are detected at time t5, these defective bits cannot be repaired unless replacement is effected by the spare row.

Therefore, determination is made that repair is not possible for the combination in which the next address corresponds to the storage of a column address (the combination enclosed by the bold line in FIG. 27).

By the above-described structure, determination can be made of redundancy repair when data of multibits are read out at one time from the memory cell array by means of the built-in self test.

Second Embodiment

The previous first embodiment is directed to the case where testing is applied on the normal memory cell array to carry out replacement with a corresponding spare row or spare column.

The second embodiment of the present invention corresponds to the case where redundancy replacement is allowed in the built-in self test when testing the spare region.

It is assumed that there are three sets of spare memory cell rows and two sets of spare memory cell columns for the sake of simplification.

Figure 28:
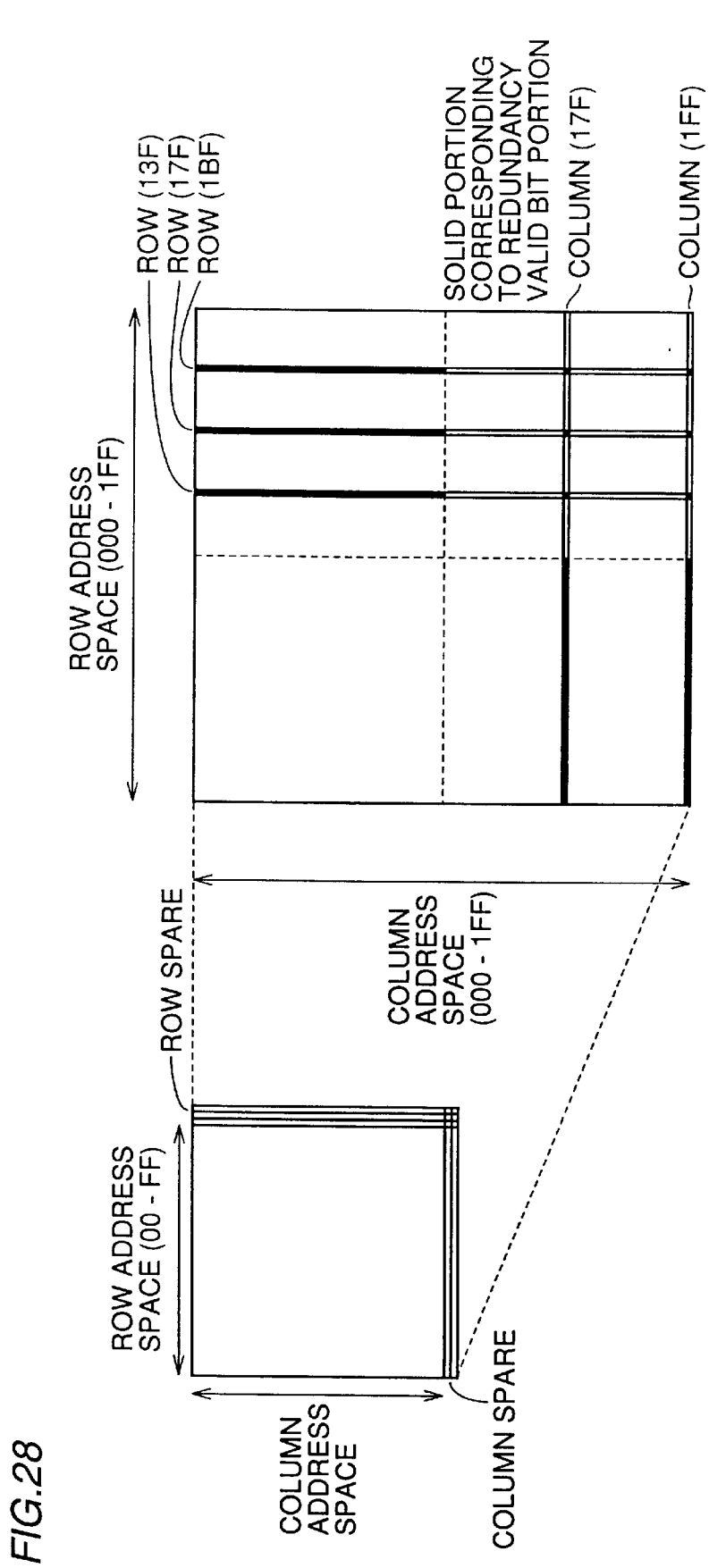
FIG. 28 is a diagram representing the concept of the structure when the spare portion is assigned a provisional address.

FIG. 28 is a diagram of the concept to describe the structure when the spare portion is assigned a provisional address.

The solid black region in FIG. 28 corresponds to the redundancy valid bit portion.

When the row address space is 00-FF, for example, 1 bit is added to the most significant bit, so that the entire row address space corresponds to 000-1FF, with 13F, 17F and 1BF assigned to the row spare.

More specifically, in FIG. 28, the spare row and spare column are allocated a provisional address so that a spare memory cell row and a spare memory cell column can be selected individually. The most significant bit of the row address and the column address is increased by 1 to enlarge the address space. When the most significant bit is 0, the normal memory cell is accessed. When the most significant bit is 1 and the spare with the provisional address is accessed, spare memory cells can be accessed.

As the algorithm to detect the repair address under control of BIST control unit 2010 in the built-in self test, determination is made of a defective address under the state where the most significant bit of the address bits is increased by 1 to replace memory cells of the defective address corresponding to the most significant bit of 0 with spare memory cells.

Since the defect detection address having the most significant bit of 1 corresponds to the defect in the spare portion, BIST control unit 2010 recognizes that the spare cannot be used.

If there is a defect in the spare column, one of the two spare columns cannot be used, and repair is effected with the remaining one spare column.

This is identical to the status where there is one spare column and three spare rows. The memory cell with the defective detected address whose most significant bit is 0 is eventually repaired with the remaining spare.

Identification of the remaining spare is made by allocating a flag to recognize that the spare with the address whose most significant bit is 1 cannot be used.

More specifically, redundancy analysis is effected while executing the test, and the defective address is stored for each combination of the sequence of the spare row and spare column that is to be replaced sequentially.

When the analysis result indicates that repair is possible, the row detective address and column defective address whose most significant bit is 1 are extracted.

Then, programming of the fuse elements is effected, provided that the fuse set corresponding to the row defective address and column defective address whose most significant bit is 1 excluded from the programming. Therefore, the defective address whose most significant bit is 0 is programmed with respect to the remaining fuse set.

Thus, although the repair algorithm itself is carried out similar to that of the first embodiment, detection of a defect in the spare portion can be carried out at the same time by assigning a provisional address to the spare portion.

Figure 29:
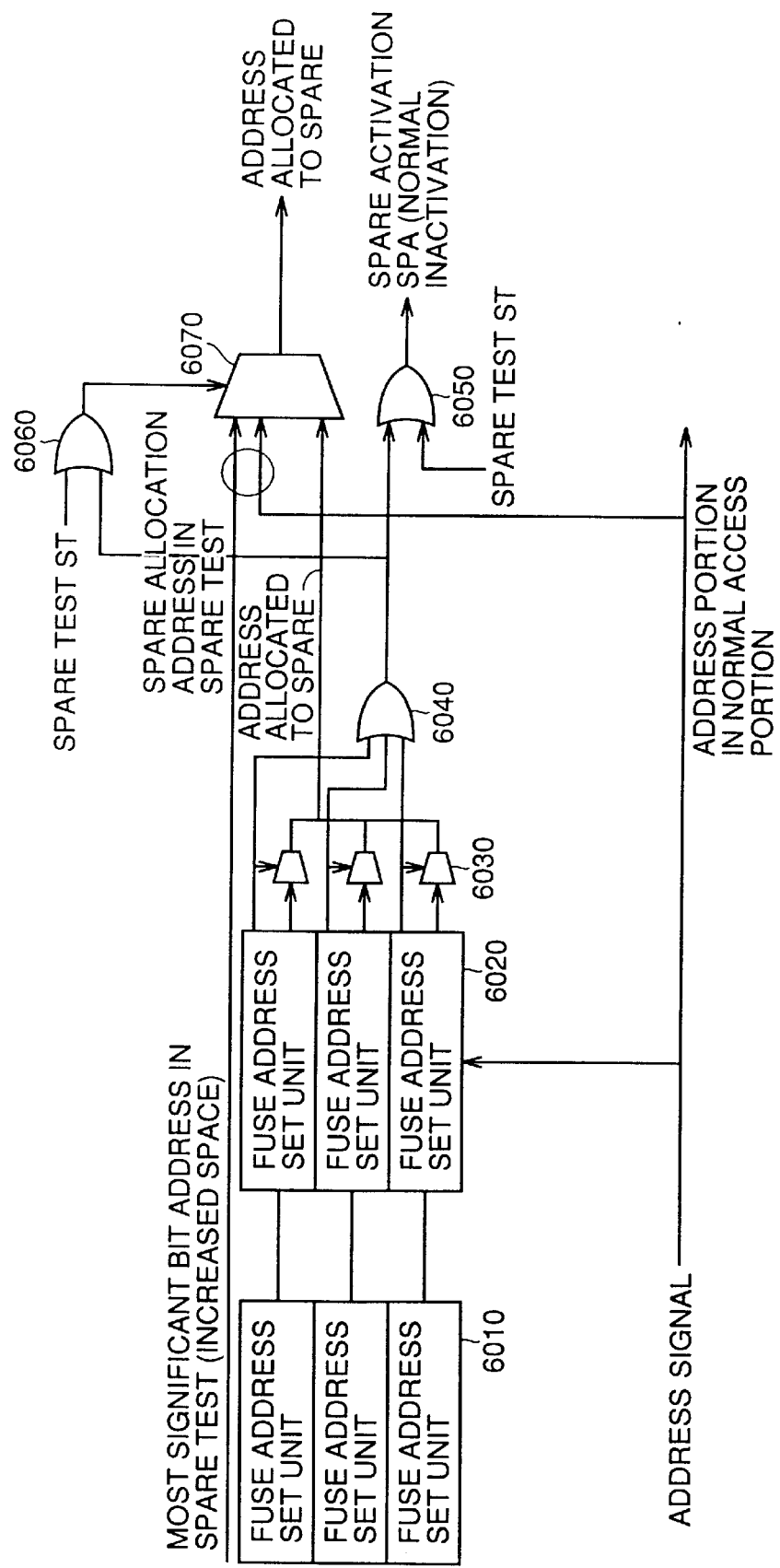
FIG. 29 is a diagram representing the concept of an address signal transmission path with respect to a row address according to a second embodiment of the present invention.

FIG. 29 is a diagram of the concept to describe the transmission path of an address signal related to the row address.

In a normal access, the input row address is applied to a fuse address comparison unit 6020 that compares the value corresponding to the programming of the repair address and the input address, similar to being sent to the row decoder.

Fuse address comparison unit 6020 compares the defective address programmed in fuse address set unit 6010 with the input address.

When none of the comparison result match, i.e. when the input address cannot be replaced with the spare, the signal output from fuse address comparison unit 6020 via gate circuit 6030 and OR circuit 6040 remains at the inactive status, and spare activation signal SPA output from OR circuit 6050 remains at the inactive state. The normal decode operation is carried out.

When any of the programmed defective address matches the input address in the normal operation, spare activation signal SPA is rendered active. The normal decode operation is rendered inactive and the normal memory cell row is not rendered active. The address corresponding to the spare passes through multiplexer 6070 to render the spare memory cell row active.

During the test of the spare, spare activation signal SPA is always at an active state since spare test signal ST is rendered active.

The test of the spare is effected by applying the address of one bit allocated for the spare space to multiplexer 6070 and rendering the spare memory cell row active in the state where the one bit address signal and the allocated address of the spare are output from multiplexer 6070.

A similar structure is provided for the column part.

Figure 30:
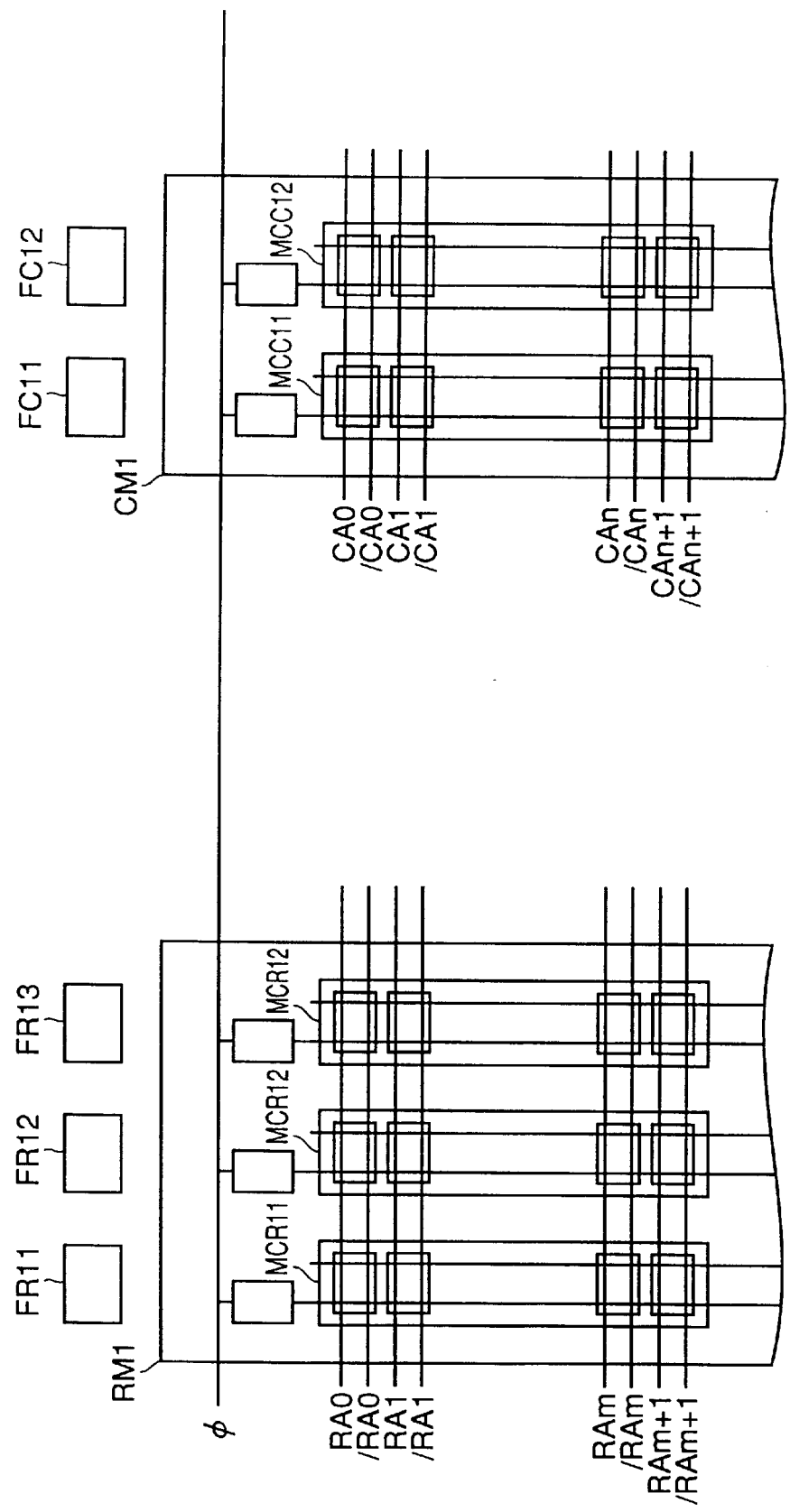
FIG. 30 is a schematic block diagram to describe a structure of an address replacement determinator 3000 of the second embodiment.

FIG. 30 is a schematic block diagram to describe the structure of address replacement determinator 3000 of the second embodiment.

Address replacement determinator 3000 differs in structure from that of FIG. 2 in the provision of storage cell trains MCR11–MCR13 corresponding to the three sets of spare memory cell rows, the provision of memory cells corresponding to addresses RAm+1, /RAm+1 and CAn+1, /CAn+1 allocated to the spare in addition to the most significant bit addresses RAm, /RAm or CAn, /CAn corresponding to the normal memory cells, and the provision of flag retain circuits FR11–FR13 and FC11–FC12 corresponding to storage cell trains MCR11–MCR13 and storage cell trains MCC11–MCC12. The same applies for the storage cell train corresponding to other combinations of the replacement sequence.

Figure 31A:
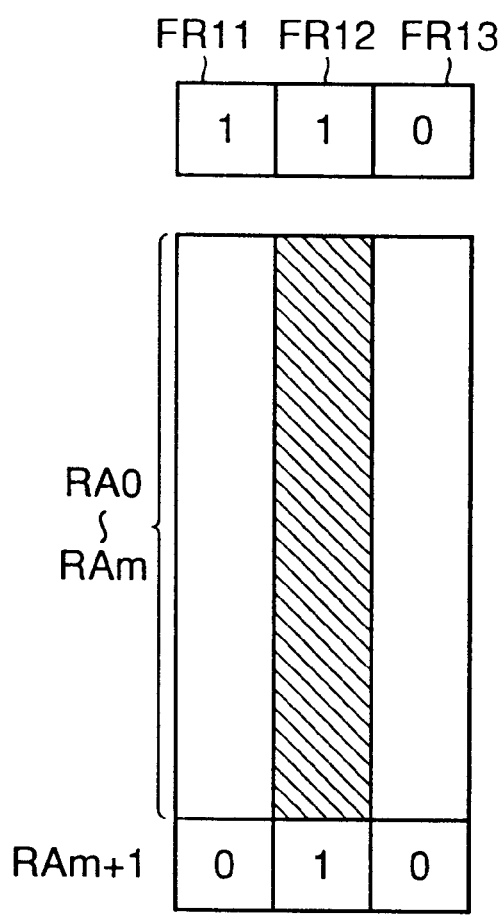
FIGS. 31A and 31B are diagrams to describe the concept of the operation of the circuit of FIG. 30.
Figure 31B:
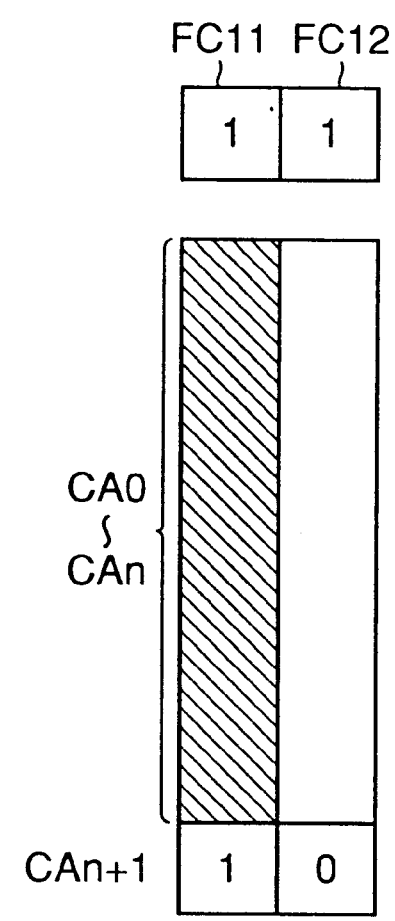
Figure 32:
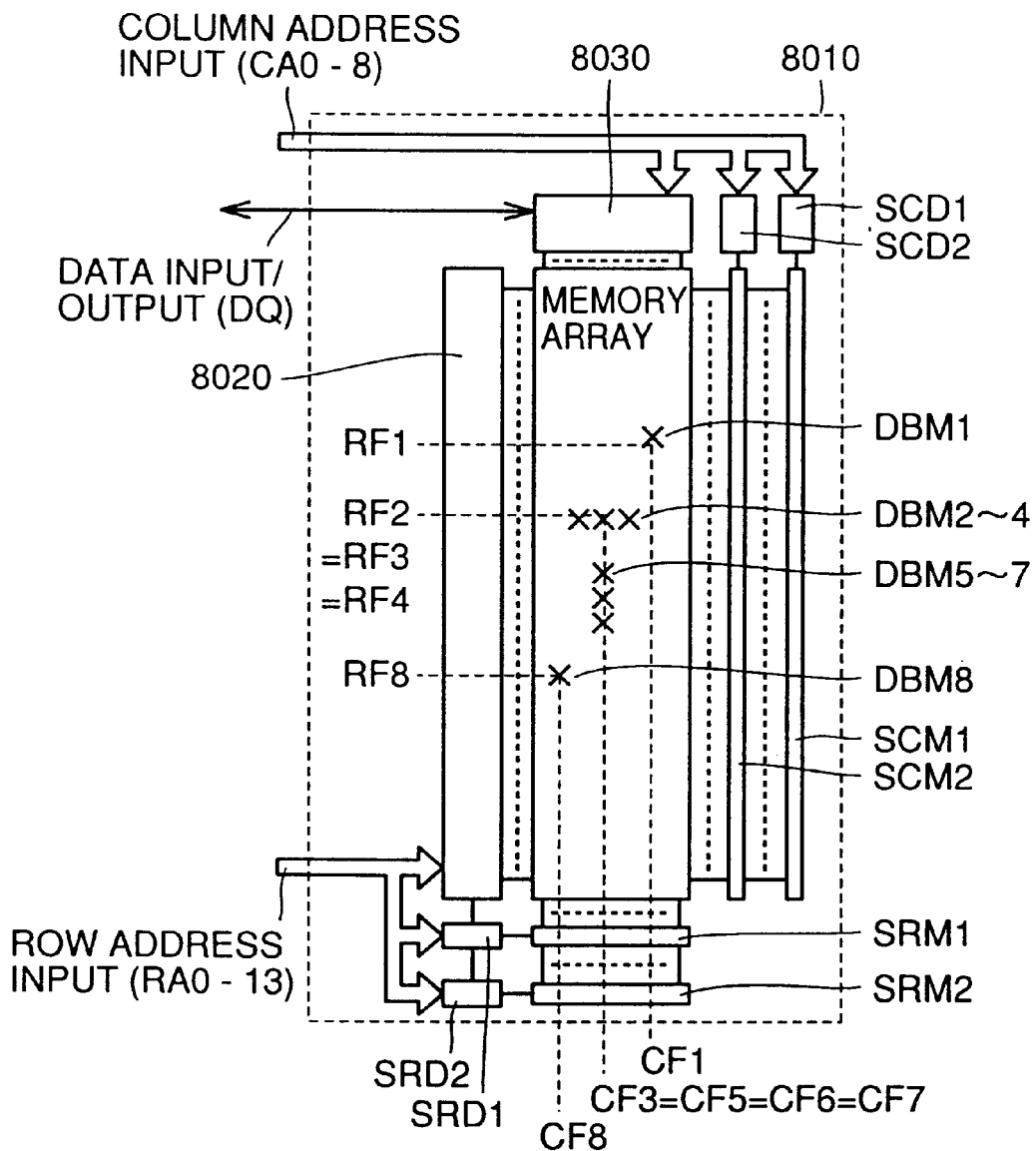
FIG. 32 is a schematic block diagram showing a structure of a redundancy circuit provided corresponding to memory array unit 8010.

FIG. 31 is a diagram of the concept to describe the operation of the circuitry of FIG. 30.

Information indicating the corresponding storage cell train in which the address is already stored by means of a replacement determination unit 3100.1 is retained in flag retain circuits FR11–FR13 and FC11–FC12. For example, it is assumed that "1" is stored in flag retain circuits FR11–FR13 and FC11–FC12 when address storage has been carried out.

In the programming of a defective address, programming is not effected in fuse address set unit 6010 for the address corresponding to flag retain circuits FR11–FR13 and FC11–FC12 with the value of "1" and address signal bit RAm+1 or CAn+1 of "1" since it indicates a defective spare.

Fuse address set unit 6010 for programming is selected so that the spare memory cell row or spare memory cell column corresponding to flag retain circuits FR11–FR13 and FC11–FC12 with the value of "1" is excluded from the usage for redundancy repair.

By the above-described structure, the built-in self test can be carried out also on the spare memory cell row and spare memory cell columns to improve the reliability of normal memory cell array redundancy repair.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a memory cell array having a plurality of memory cells arranged in a matrix, each memory cell storing data,
   said memory cell array including
      a normal memory cell array with a plurality of normal memory cells,
      a spare memory cell row with a plurality of spare memory cell rows, and
      a spare memory cell column with a plurality of spare memory cell columns;
   a memory cell select circuit to select a plurality of memory cells belonging to the same row in said memory cell array at one time according to an address signal;
   a data transmission circuit to transfer said stored data with respect to said selected plurality of memory cells; and
   tester circuit detecting a defective memory cell in said memory cells, and determining which of said spare memory cell is to be used for replacement,
   said tester circuit including
      a comparison circuit comparing stored data from said selected memory cell with expected value data in a test readout operation,
      an address storage circuit to store a defective address corresponding to a defective memory cell according to a comparison result of said comparison circuit, and
      a control circuit to control a test operation, said control circuit determining repair using said spare memory cell row when a plurality of defective memory cells are detected from said plurality of memory cells selected at one time.

2. The semiconductor integrated circuit device according to claim 1, wherein said tester circuit further includes a signal generation circuit generating said address signal to sequentially select said memory cell, test data to be written into said memory cell selected in a test write operation, and said expected value data to be read out from said memory cell in a test read operation.

3. The semiconductor integrated circuit device according to claim 1, wherein said control circuit determines repair using said spare memory cell row when more defective memory cells than the number of said spare memory cell columns are detected from said plurality of memory cells selected at one time.

4. The semiconductor integrated circuit device according to claim 1, wherein said memory cell select circuit selects n×n (n: natural number) memory cells at one time,
   wherein said comparison circuit includes
      a match detection circuit comparing data read out from said n×n memory cells selected with the expected value, and generating n×n match detection signals indicating a matching result,
      n first logic gates provided for each column of a signal matrix formed of said n×n match detection signals to determine whether n corresponding match detection signals match,
      n second logic gates provided for each row of the signal matrix formed of said n×n match detection signals to determine whether n corresponding match detection signals match, and
      a third logic gate receiving outputs of said first and second logic gates to determine whether there is a signal indicating mismatch out of said n×n match detection signals.

5. The semiconductor integrated circuit device according to claim 4, wherein said comparison circuit further includes
   n first parity determination circuits provided for each column of the signal matrix formed of said n×n match detection signals to determine parity of corresponding n match detection signals,
   n second parity determination circuits provided for each row of the signal matrix formed of said n×n match detection signals to determine parity of corresponding n match detection signals,
   a plurality of first defective detection circuits provided for each column of said signal matrix to detect the number of match detection signals indicating mismatch included in a column of said signal matrix according to a determination result of a corresponding said first parity determination circuit and a determination result of a corresponding said first logic gate,
   a first defective number add circuit to add the detected result of said plurality of first defective detection circuits,
   a plurality of second defective detection circuits provided for each row in said signal matrix to detect the number of match detection signals indicating mismatch included in a row of said signal matrix according to a determination result of a corresponding said second parity determination circuit and a corresponding said second logic gate,
   a second defective number add circuit to add the detected result of said plurality of second defective detection circuits, and
   defective number determination circuit receiving outputs of said first and second defective add circuits to provide the output of the larger number of addition as the defective number.

6. The semiconductor integrated circuit device according to claim 1, said memory cell select circuit further including means for selecting individually said spare memory cell row and spare memory cell column according to said address signal.

7. The semiconductor integrated circuit device according to claim 6, wherein said address signal comprises a plurality of bits of normal address signals to select a memory cell in said normal memory cell array, and an additional bit to select individually said spare memory cell row and spare memory cell column.

8. The semiconductor integrated circuit device according to claim 7, said address storage circuit further including means for storing identification information to identify that a detected defective address corresponds to said spare memory cell row and spare memory cell column.

9. The semiconductor integrated circuit device according to claim 8, said memory cell select circuit including a defective address storage circuit to store a detected defective address, and when said address signal matches said defective address, suppress selection of a normal memory cell and select any of said spare memory cell row and spare memory cell column.

10. The semiconductor integrated circuit device according to claim 9, wherein said memory cell select circuit carries out replacement with any of said spare memory cell row and spare memory cell column that is not defective according to said identification information.

* * * * *